(12) United States Patent
Hagihara

(10) Patent No.: US 8,885,081 B2
(45) Date of Patent: Nov. 11, 2014

(54) A/D CONVERTER AND SOLID-STATE IMAGING APPARATUS

(75) Inventor: Yoshio Hagihara, Tokyo (JP)

(73) Assignee: Olympus Corporation, Tokyo (JP)

( * ) Notice: Subject to any disclaimer, the term of this patent is extended or adjusted under 35 U.S.C. 154(b) by 0 days.

(21) Appl. No.: 13/408,508

(22) Filed: Feb. 29, 2012

(65) Prior Publication Data
US 2012/0249850 A1    Oct. 4, 2012

Related U.S. Application Data

(63) Continuation of application No. PCT/JP2010/064891, filed on Sep. 1, 2010.

(30) Foreign Application Priority Data

Sep. 1, 2009   (JP) .............................. P2009-201522

(51) Int. Cl.
  *H04N 5/335*     (2011.01)
  *H04N 5/235*     (2006.01)
  *H03M 1/14*      (2006.01)
  *H04N 5/378*     (2011.01)
  *H03M 1/56*      (2006.01)

(52) U.S. Cl.
  CPC ................. *H03M 1/14* (2013.01); *H04N 5/378* (2013.01); *H03M 1/56* (2013.01)
  USPC .......................... 348/294; 348/222.1; 348/302

(58) Field of Classification Search
  CPC ..................................................... H04N 5/335
  USPC ........ 348/222.1, 302, 294; 341/126, 155, 156
  See application file for complete search history.

(56) References Cited

U.S. PATENT DOCUMENTS

| 5,128,624 | A | 7/1992 | Hoshino et al. |
| 5,289,135 | A | 2/1994 | Hoshino et al. |

(Continued)

FOREIGN PATENT DOCUMENTS

| JP | 3-220814 A | 9/1991 |
| JP | 6-283984 A | 10/1994 |

(Continued)

OTHER PUBLICATIONS

Japanese Office Action dated May 7, 2013, issued in Japanese application No. 2009-201522, w/English translation.

(Continued)

*Primary Examiner* — Nhan T Tran
*Assistant Examiner* — Chan Nguyen
(74) *Attorney, Agent, or Firm* — Westerman, Hattori, Daniels & Adrian, LLP

(57) ABSTRACT

In an A/D converter, a ramp unit generates a reference signal that increases or decreases over time. A comparison unit starts a comparison process of comparing an analog signal to the reference signal at a timing related to input of the analog signal and ends the comparison process at a timing at which the reference signal satisfies a predetermined condition with respect to the analog signal. A VCO includes a plurality of delay units having the same configuration and starts a transition process at a timing related to the start of the comparison process. A count unit counts a clock from the VCO. A low-order latch unit latches a low-order logic state, which is a logic state of the plurality of delay units, at a first timing related to the end of the comparison process. A high-order latch unit latches a high-order logic state.

11 Claims, 24 Drawing Sheets

(56) References Cited

U.S. PATENT DOCUMENTS

| | | | |
|---|---|---|---|
| 5,568,071 A | 10/1996 | Hoshino et al. | |
| 7,248,197 B2* | 7/2007 | Watanabe | 341/157 |
| 7,292,175 B2* | 11/2007 | Watanabe | 341/157 |
| 7,755,017 B2* | 7/2010 | Taura | 250/208.1 |
| 8,421,665 B2* | 4/2013 | Hagihara et al. | 341/166 |
| 2002/0158127 A1* | 10/2002 | Hori et al. | 235/454 |
| 2005/0190096 A1 | 9/2005 | Isomura | |
| 2006/0244649 A1* | 11/2006 | Terazawa et al. | 341/155 |
| 2007/0120723 A1* | 5/2007 | Watanabe | 341/155 |
| 2008/0042048 A1* | 2/2008 | Asayama et al. | 250/208.1 |
| 2008/0135729 A1* | 6/2008 | Taura | 250/208.1 |
| 2009/0128653 A1* | 5/2009 | Tanaka | 348/222.1 |
| 2011/0068961 A1* | 3/2011 | Hashimoto et al. | 341/118 |
| 2011/0164160 A1* | 7/2011 | Harada | 348/302 |
| 2012/0098993 A1* | 4/2012 | Takahashi | 348/222.1 |
| 2013/0146751 A1* | 6/2013 | Hagihara | 250/208.1 |

FOREIGN PATENT DOCUMENTS

| | | | |
|---|---|---|---|
| JP | 2005-244758 A | | 9/2005 |
| JP | 2005-311933 A | | 11/2005 |
| JP | 2005-347931 A | | 12/2005 |
| JP | 2006-148678 | * | 6/2006 |
| JP | 2006-148678 A | | 6/2006 |
| JP | 2008-092091 A | | 4/2008 |
| JP | 2009-033297 A | | 2/2009 |
| JP | 2009-038726 A | | 2/2009 |
| JP | 2009-038781 A | | 2/2009 |
| JP | 2009-516414 A | | 4/2009 |
| JP | 2010-258817 A | | 11/2010 |
| WO | 2007/054902 A1 | | 5/2007 |

OTHER PUBLICATIONS

International Search Report of PCT/JP2010/064891, date of mailing Oct. 19, 2010.

* cited by examiner

A/D CONVERTER AND SOLID-STATE IMAGING APPARATUS

This application is a continuation application based on a PCT Patent Application No. PCT/JP2010/64891 whose priority is claimed on Japanese Patent Application No. 2009-201522, filed Sep. 1, 2009. The contents of both the PCT Application and the Japanese Application are incorporated herein by reference.

TECHNICAL FIELD

The present invention relates to an A/D converter (analog-to-digital converter) and a solid-state imaging apparatus using the A/D converter.

BACKGROUND ART

Examples in which an A/D converter is used according to the related art are disclosed in Patent Documents 1 to 4. First, the configuration and operation of an A/D converter disclosed in Patent Document 1 will be described.

FIG. 24 is a diagram illustrating the configuration of a MOS sensor that uses an A/D converter according to a first related art disclosed in Patent Document 1. The MOS sensor includes an A/D conversion circuit 1106 that includes a comparator 1107 and a digital memory 1108 in each column of pixels 1101. A digital (binary) value output from a counter 1104 is input to a D/A conversion circuit (hereinafter, referred to as a DAC) 1105. The DAC 1105 generates a ramp voltage (ramp wave) 1122 in accordance with the input digital value and outputs the ramp voltage (ramp wave) 1122 as a reference signal to one of input units of the comparator 1107. The output of the counter 1104 is distributed to the digital memories 1108 in the respective columns via the binary-to-gray code converter 1115. A pixel signal is input as an analog signal to be subjected to A/D conversion from the pixel 1101 to the other of the input units of the comparator 1107 of each A/D conversion circuit 1106 via a read signal line 1103.

Next, an A/D conversion process according to the first related art will be described. First, the counter 1104 starts counting a value from an initial value in synchronization with a clock signal 1121 input from a clock generation circuit 1120 and the DAC 1105 starts generating the ramp voltage (ramp wave) 1122. Then, a signal read from the pixels 1101 in each column and the common ramp voltage (ramp wave) 1122 varying in synchronization with the counted value of the counter 1104 are input to the comparator 1107 at each column. The counted value of the counter 1104 is distributed to the digital memories 1108 in parallel to the ramp voltage. When a magnitude relation between two input signals in the comparator 1107 at a given column is exchanged, an output voltage of the comparator 1107 is inverted and the digital memory 1108 at this column retains the counted value. Since the ramp voltage (ramp wave) 1122 input into the comparator 1107 and the counted value input into the digital memory 1108 are synchronized with each other, the signal read from the pixel is A/D converted into a value (digital value) retained in the digital memory by the above-described process.

The A/D conversion scheme described above is a kind of scheme called counting ADC (counting A/D conversion) according to general classification of the A/D conversion in a scheme called ramp-type A/D conversion (Ramp Run-up ADC). Using the ramp voltage (ramp wave) as a reference signal is equivalent to converting an analog signal potential from a pixel into the length of time. Further, since the A/D conversion is realized by measuring the length of time by the use of the clock signal of a fixed frequency, this term is used.

In an A/D converter according to the second related art disclosed in Patent Documents 2 to 4, resolution can be further improved by setting the counted value of the counter 1104 to high-order bits, generating a multi-phase clock by delaying the phase of a clock (or a clock output from the counter) input to the counter, and setting the logic state to the low-order bits.

For example, when the A/D conversion of 10 bits is realized by the A/D converter according to the first related art, it is necessary to perform counting by the number of gray scales of 10 bits (that is 1024 times) in the comparison between an analog signal to be subjected to the A/D conversion and the ramp voltage (ramp wave) generated by a DAC.

Here, an imager used as a specific device using the A/D converter in a digital still camera (DSC) or the like will be exemplified. In regard to a specific specification, the number of pixels is 20 million and the frame rate is 60 frame/sec. To facilitate the description, it is assumed that the pixel arrangement of 20 million pixels is an aspect ratio of 4000 rows×5000 columns and there is no blanking period for further simplification. Then, a read period of one row is 60 frame/sec×4000 rows/frame=240 Kline/sec. That is, a read rate of one row is 240 kHz. When the A/D converter according to the first related art is applied to this device, comparison of the number of gray scales $2^{10}=1024$ times has to be performed in the read period of one row in the A/D conversion of 10 bits. Therefore, it is necessary to change the counted value of the counter outputting data to the digital memory at about 240 MHz which is about a thousand times the read rate of one row.

In this calculation, a wait period in which the A/D conversion circuit receives data from the pixels or a transmission period in which the result of the A/D conversion is output to a memory, that is, a period in which the comparison process as the A/D conversion is not performed, is not considered. Further, since an OB (Optical Black) pixel period or a blanking period is excluded, actually, the read rate of one row is a frequency higher than the estimated frequency.

Next, the read rate of one row will be calculated in the same way using the A/D converter according to the second related art. For example, it is assumed that 10 bits are composed of 8 high-order bits and 2 low-order bits. In the case of the high-order bits, the calculation is made by changing the counted value of the counter outputting data to the digital memory at about 60 MHz which is 256 times the read rate of one row. In the case of the low-order bits, a digital value is obtained by delaying the phase of a clock (a clock output from the counter) input to the counter by 0, $\pi/4$, $\pi/2$, and $3\pi/4$ and retaining and encoding the logic state. Further, it is assumed that 10 bits are composed of 6 high-order bits and 4 low-order bits. In the case of the high-order bits, the calculation is made by changing the counted value of the counter outputting data to the digital memory at about 15 MHz which is 64 times the read rate of one row. In the case of the low-order bits, a digital value is obtained by delaying the phase of a clock (a clock output from the counter) input to the counter by 0, $\pi/16$, $\pi/8$, $3\pi/16$, $\pi/4$, $5\pi/16$, $3\pi/8$, $7\pi/16$, $\pi/2$, $9\pi/16$, $5\pi/8$, $11\pi/16$, $3\pi/4$, $13\pi/16$, $7\pi/8$, and $15\pi/16$ and retaining and encoding the logic state.

CITATION LIST

Patent Document

[Patent Document 1] Japanese Patent Application, First Publication No. 2005-347931

[Patent Document 2] Japanese Patent Application, First Publication No. 2009-33297
[Patent Document 3] Japanese Patent Application, First Publication No. 2009-38726
[Patent Document 4] Japanese Patent Application, First Publication No. 2009-38781

SUMMARY OF INVENTION

An A/D converter according to the aspect of the present invention includes: a reference signal generation unit that generates a reference signal that increases or decreases over time; a comparison unit that starts a comparison process of comparing an analog signal to the reference signal at a timing related to input of the analog signal to be subjected to A/D conversion and ends the comparison process at a timing at which the reference signal satisfies a predetermined condition with respect to the analog signal; a ring delay circuit that includes a plurality of delay units and starts a transition process at a timing related to the start of the comparison process; a count unit that counts a clock from the ring delay circuit; a low-order latch unit that latches a low-order logic state, which is a logic state of the plurality of delay units, at a first timing related to the end of the comparison process; a high-order latch unit that latches a high-order logic state, which is a logic state of the count unit, at the first timing related to the end of the comparison process; and a calculation unit that calculates a digital signal corresponding to the analog signal based on data of the low-order latch unit and the high-order latch unit.

In the A/D converter according to the present invention, the number of delay units may be odd.

In the A/D converter according to the present invention, the number of delay units may be odd and each of the plurality of delay units may include an odd number of inversion elements.

In the A/D converter according to the present invention, the odd number of inversion elements of each delay unit may be each configured by a fully differential inversion circuit.

In the A/D converter according to the present invention, the plurality of delay units are configured to control delay amounts of the delay units.

In the A/D converter according to the present invention, the delay amount of each of the plurality of delay units may be controlled by a current flowing in the delay unit.

In the A/D converter according to the present invention, the calculation unit may rearrange the data of the low-order latch unit, which is output from the plurality of delay units, to signal groups rising in order at a given time interval or falling in order at a given time interval. The calculation unit may detect a state transition position in the signal group at the first timing related to the end of the comparison process.

In the A/D converter according to the present invention, the count unit may output a redundant high-order logic state other than the high-order logic state. The A/D converter may further include a redundant high-order latch unit that latches the redundant high-order logic state, as a latch unit, other than the low-order latch unit and the high-order latch unit. The redundant high-order logic state may be a state where at least a part of the high-order logic state is delayed by a given time or the high-order logic state may be a state where at least a part of the redundant high-order logic state is delayed by a given time.

In the A/D converter according to the present invention, the comparison unit may output a signal indicating the first timing related to the end of the comparison process and output a signal indicating a second timing delayed from the first timing by a given delay time.

In the A/D converter according to the present invention, the reference signal generation unit may be configured by an integration circuit.

In the A/D converter according to the present invention, the reference signal generation unit may be configured by a DAC circuit.

In the A/D converter according to the present invention, the reference signal generation unit may further include an LPF circuit at a rear stage of the DAC circuit.

In the A/D converter according to the present invention, a filter constant of the LPF circuit may be controlled in accordance with at least a delay amount of the delay unit and a quantization step of the DAC circuit.

According to another aspect of the present invention, there is provided a solid-state imaging apparatus includes: an imaging unit in which a plurality of pixels outputting a pixel signal in accordance with an amount of an incident electromagnetic wave are arranged in a matrix form; the A/D converter that employs an analog signal corresponding to the pixel signal as an analog signal to be subjected to A/D conversion; and a control unit that controls the imaging unit and the A/D converter.

In the solid-state imaging apparatus according to the present invention, the pixel signal includes a reference level and a signal level, the comparison unit may perform a first comparison process of comparing the reference level to the reference signal and a second comparison process of comparing the signal level to the reference signal. The high-order latch unit may include first and second high-order latch units. The low-order latch unit may include first and second low-order latch units. First data associated with the first comparison process and second data associated with the second comparison process may be retained.

In the solid-state imaging apparatus according to the present invention, the first data may be retained in the first high-order latch unit and the first low-order latch unit, the retained first data may be transmitted to the second high-order latch unit and the second low-order latch unit, and then the second data may be retained in the first high-order latch unit and the first low-order latch unit.

In the solid-state imaging apparatus according to the present invention, the count unit may output the redundant high-order logic state in addition to the high-order logic state. The high-order latch unit may further include first and second redundant high-order latch units in addition to the first and second high-order latch units. The low-order latch unit may include first and second low-order latch units.

In the solid-state imaging apparatus according to the present invention, the first data may be retained in the first high-order latch unit, the first redundant high-order latch unit, and the first low-order latch unit, the retained data may be transmitted to the second high-order latch unit, the second redundant high-order latch unit, and the second low-order latch unit, and then the second data may be retained in the first high-order latch unit, the first redundant high-order latch unit, and the first low-order latch unit.

In the solid-state imaging apparatus according to the present invention, the data may be retained in the first or second high-order latch unit at one of the first timing related to the end of the comparison process and the second timing delayed from the first timing related to the end of the comparison process by the given delay time, and the data may be retained in the first or second redundant high-order latch unit at the other of the first timing related to the end of the comparison process and the second timing delayed from the first timing related to the end of the comparison process by the given delay time.

In the solid-state imaging apparatus according to the present invention, the count unit may be provided in each column or every plurality of columns of the imaging unit to configure a column count unit. The clock from the ring delay circuit may be used as a count clock of the column count unit.

In the solid-state imaging apparatus according to the present invention, the column count unit may have an up-count mode and a down-count mode, counting associated with the first comparison process is performed in one of the up-count mode and the down-count mode, and counting associated with the second comparison process may be performed in the other of the up-count mode and the down-count mode.

According to further aspect of the present invention, there is provided an A/D converter includes: a reference signal generation unit that generates a reference signal that increases or decreases over time; a comparison unit that starts a comparison process of comparing an analog signal to the reference signal at a timing related to input of the analog signal to be subjected to A/D conversion and ends the comparison process at a timing at which the reference signal satisfies a predetermined condition with respect to the analog signal; a ring delay circuit that includes a plurality of delay units and starts a transition process at a timing related to the start of the comparison process; a count unit that counts a clock from the ring delay circuit and retains a count value as a high-order logic state at a first timing related to the end of the comparison process; a low-order latch unit that latches a low-order logic state, which is a logic state of the plurality of delay units, at said first timing related to the end of the comparison process; and a calculation unit that calculates a digital signal corresponding to the analog signal based on data of the low-order latch unit and the high-order latch unit.

According to further aspect of the present invention, there is provided a solid-state imaging apparatus includes: an imaging unit in which a plurality of pixels outputting a pixel signal in accordance with an amount of an incident electromagnetic wave are arranged in a matrix form; the A/D converter that employs an analog signal corresponding to the pixel signal as an analog signal to be subjected to A/D conversion; and a control unit that controls the imaging unit and the A/D converter.

In the solid-state imaging apparatus according to the present invention, the count unit may be provided in each column of the imaging unit to configure a column count unit, and wherein the clock from the ring delay circuit may be used as a count clock of the column count unit.

DESCRIPTION OF EMBODIMENTS

Hereinafter, embodiments of the present invention will be described with reference to the drawings.

First Embodiment

Figure 1:
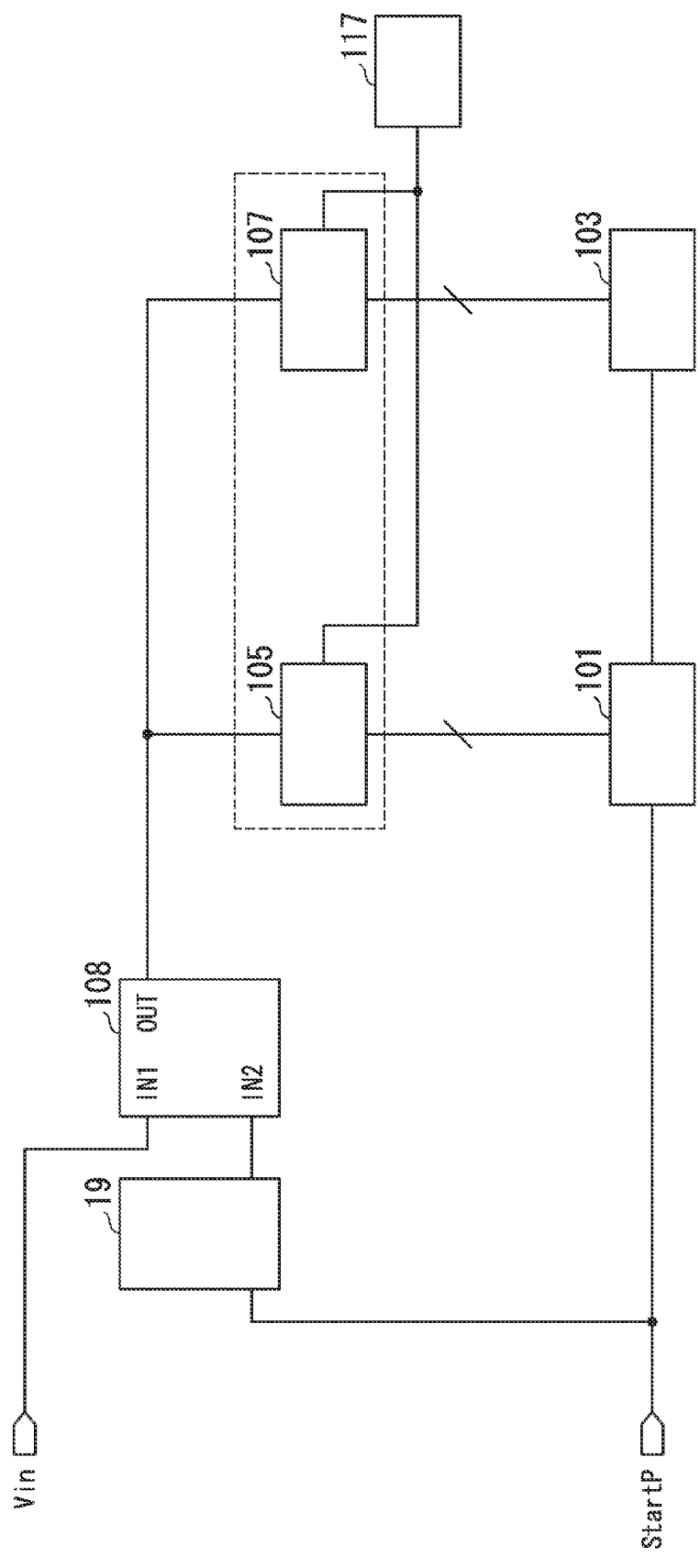
FIG. 1 is a block diagram illustrating the configuration of an A/D converter according to a first embodiment of the present invention.

FIG. 1 is a diagram illustrating an example of the overall configuration of an A/D converter according to a first embodiment of the present invention. Hereinafter, the configuration of the A/D converter shown in FIG. 1 will be described. The A/D converter includes a ramp unit 19, a comparison unit 108, a VCO 101, a count unit 103, a low-order latch unit 105, a high-order latch unit 107, and a calculation unit 117.

The ramp unit 19 generates a reference signal (ramp wave) that increases or decreases over time. The comparison unit 108 includes a first input terminal IN1 to which an analog signal Vin to be subjected to A/D conversion, a second input terminal IN2 to which the ramp wave is input from the ramp unit 19, and a third terminal OUT from which a comparison result is output. The VCO 101 is a ring delay circuit that includes n (where n is a natural number equal to or greater than 2) delay units. The count unit 103 counts a clock from the VCO 101. The low-order latch unit 105 retains the low-order logic state of the VCO 101. The high-order latch unit 107 retains the high-order logic state of the count unit 103. The calculation unit 117 calculates a digital signal based on data of the low-order latch unit 105 and the high-order latch unit 107.

Next, a process of the example will be described. First, when the logic state of a start pulse (StartP) is changed from Low to High, the VCO 101 starts a transition process and the count unit 103 starts counting from its initial value. Simultaneously, the ramp unit 19 starts generating a ramp wave. Then, when an analog signal Vin to be subjected to A/D conversion and the ramp wave changed (increased or decreased) substantially in synchronization with the high-order logic state of the count unit 103 are input to the comparison unit 108, the comparison unit 108 starts a comparison process.

In parallel to the above process, the low-order logic state of the VCO 101 is distributed to the low-order latch unit 105 and the high-order logic state of the count unit 103 is distributed to the high-order latch unit 107. When the magnitude relation between the two input signals input into the comparison unit 108 is changed, the output of the comparison unit 108 is inverted, and the input logic states of the low-order latch unit 105 and the high-order latch unit 107 are retained. Since the ramp wave input into the comparison unit 108 is almost synchronous with the input logic states input to the low-order latch unit 105 and the high-order latch unit 107, the analog signal to be subjected to the A/D conversion is A/D converted into the value retained in the low-order latch unit 105 and the high-order latch unit 107. Thereafter, the calculation unit 117 calculates synthesized data based on the data from the low-order latch unit 105 and the high-order latch unit 107.

Figure 2:
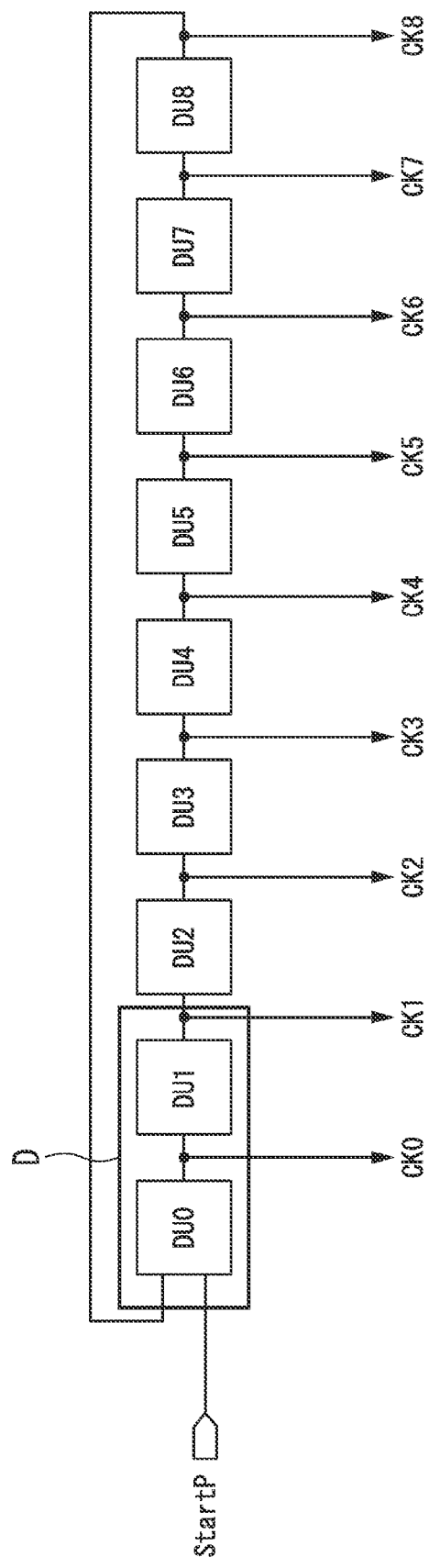
FIG. 2 is a block diagram illustrating the configuration of a VCO of the A/D converter according to the first embodiment of the present invention.

FIG. 2 is a diagram illustrating an example of the configuration of the VCO 101 in FIG. 1. The VCO 101 has a configuration in which delay units are connected to each other to form odd stages (in this example, nine stages) in a ring shape. The output terminals of the delay units DU0 to DU8 output signals CK0 to CK8 regarding the states of the delay units being operating, respectively. Here, the case has been described in which the state CK8 serves as a clock output to the count unit 103. The number of delay units is nine, but the present invention is not limited thereto.

Figure 3:
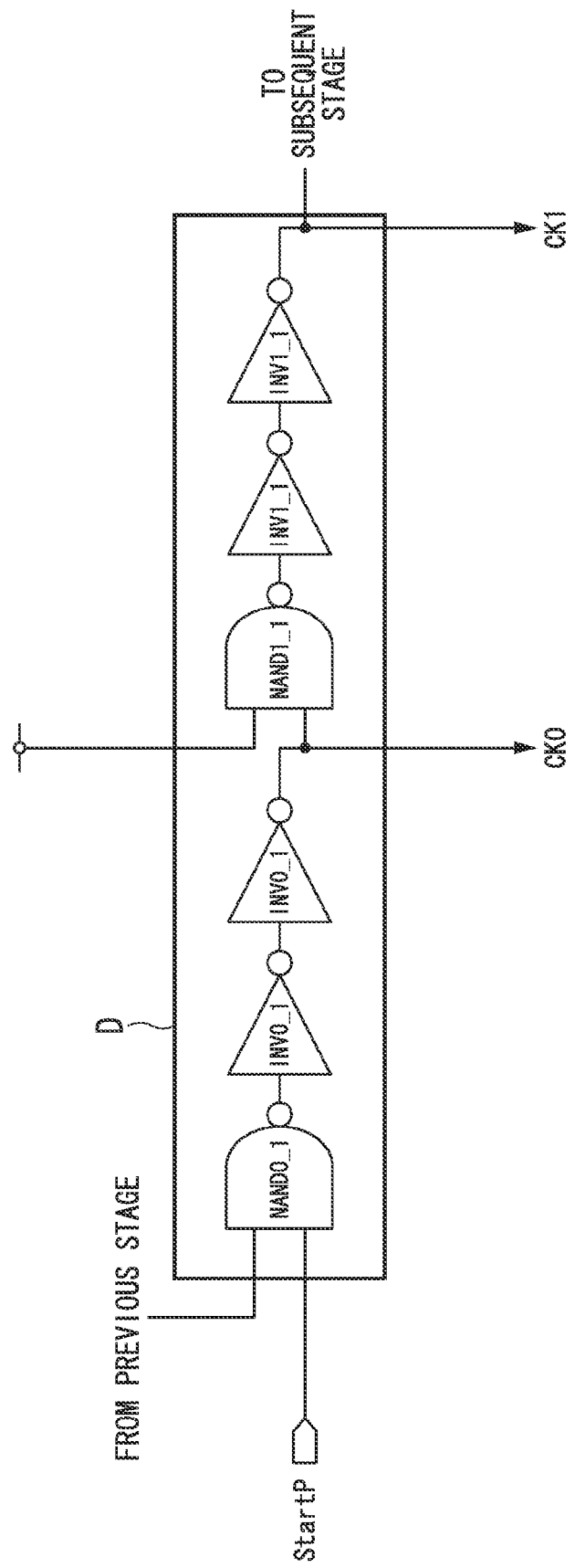
FIG. 3 is a block diagram illustrating the partial configuration of the VCO of the A/D converter according to the first embodiment of the present invention.

FIG. 3 is a diagram illustrating a first example of an expanded portion D of the delay units in FIG. 2. Each of the delay units DU0 to DU8 includes three inversion elements (NAND*_1, INV*1, and INV*_2). Here, numerals (0 to 8) corresponding to the delay units DU0 to DU8, respectively, are input to "*". The case has been described in which the number of inversion elements is three, but the present invention is not limited thereto. Further, the NAND circuit and INV (Inverter) circuits are used to form the delay unit, but any combination of the circuits may be used.

Figure 4:
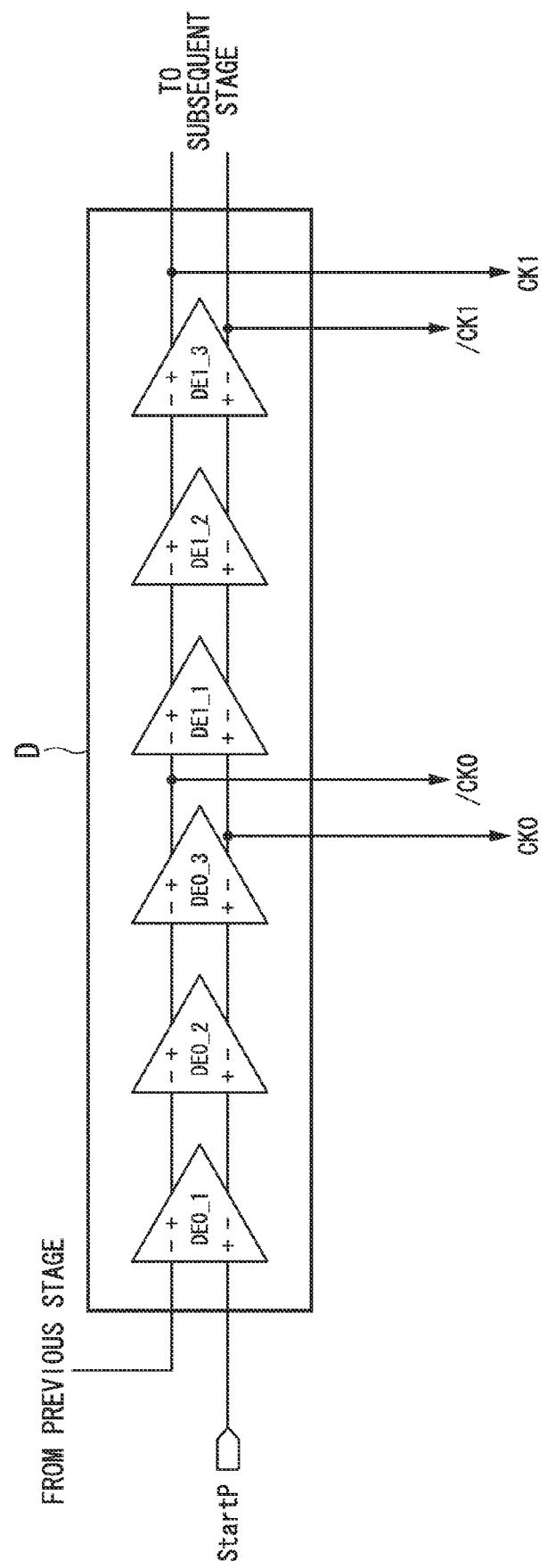
FIG. 4 is a block diagram illustrating the partial configuration of the VCO of the A/D converter according to the first embodiment of the present invention.

FIG. 4 is a diagram illustrating a second example of the expanded portion D of the delay units in FIG. 2. Each of the delay units DU0 to DU8 includes three fully differential inversion elements (DE*_1 to DE*_3). Here, numerals (0 to 8) corresponding to the delay units DU0 to DU8, respectively, are input to "*". The case has been described in which the number of fully differential inversion elements is three, but the present invention is not limited thereto.

Figure 5:
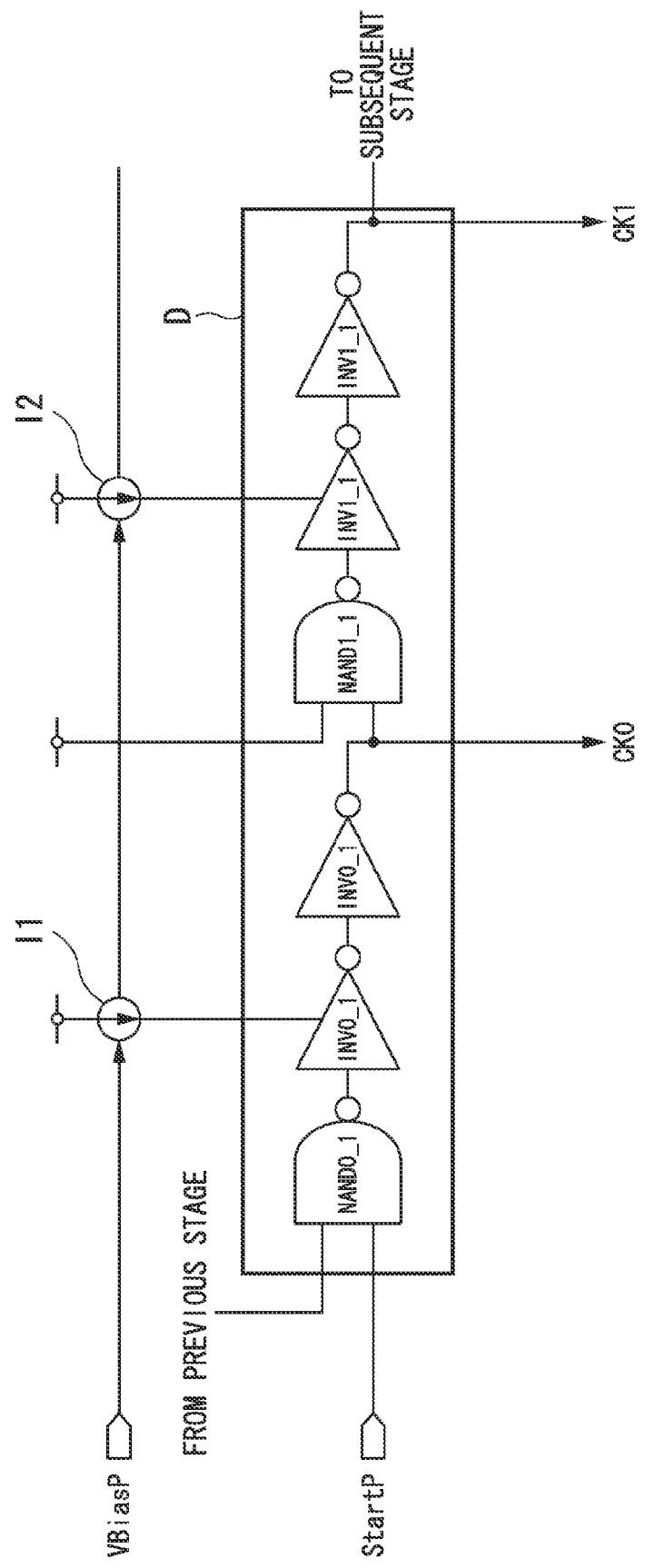
FIG. 5 is a block diagram illustrating the partial configuration of the VCO of the A/D converter according to the first embodiment of the present invention.

FIG. 5 is a diagram illustrating a third example of the expanded portion D of the delay units in FIG. 2. FIG. 5 is different from FIG. 3 in that current sources I1 and I2 controlling the delay amounts of the delay units DU0 to DU8 are inserted to the power line of the inversion element INV*_1 forming of the delay units DU0 to DU8. With such a configuration, the delay amount can be made to be varied, and thus a feedback process such as a process of operating the VCO 101 in synchronization with another clock can be performed. The case has been described in which the current sources are inserted to the power line of the inverting elements INV*_1, but the present invention is not limited thereto.

Figure 6:
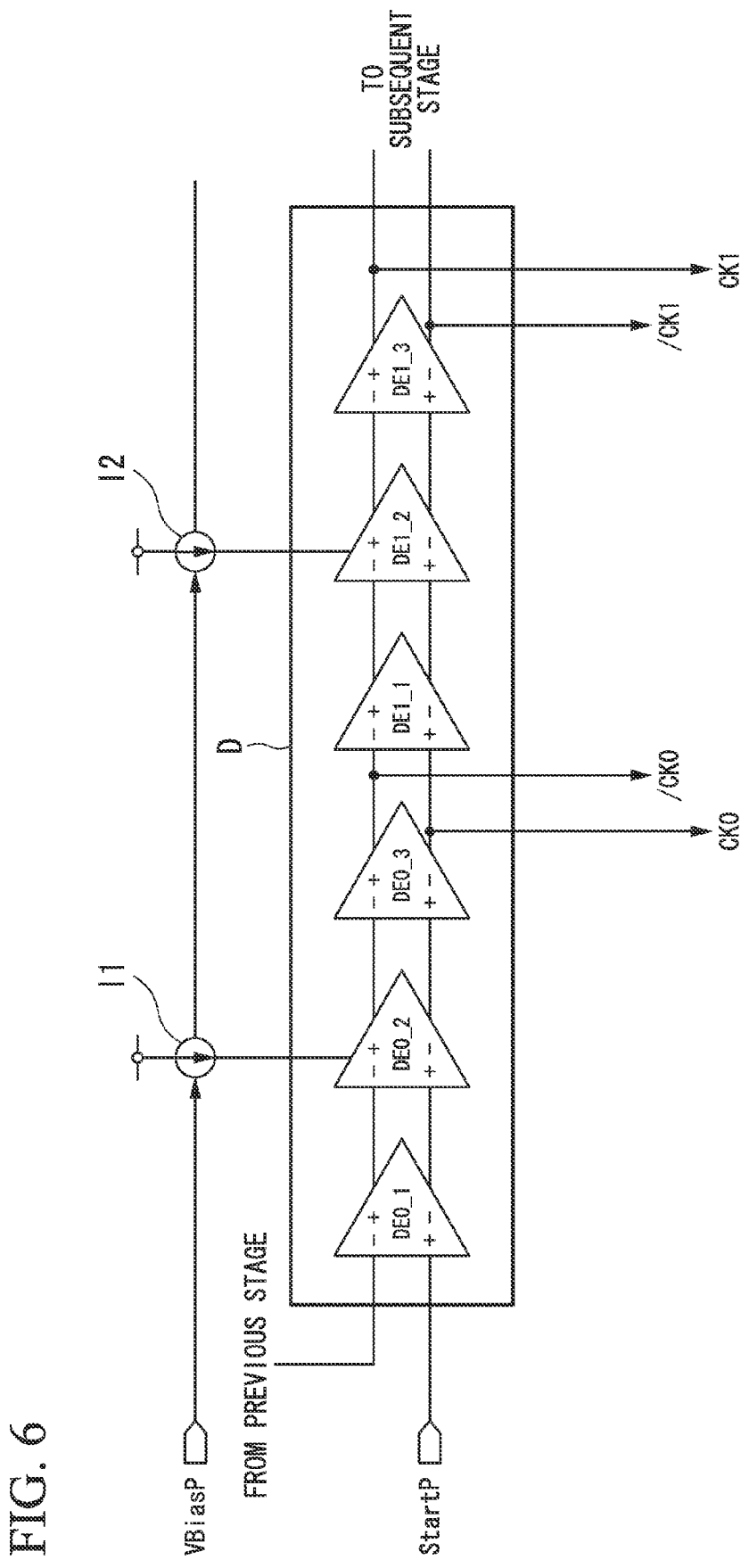
FIG. 6 is a block diagram illustrating the partial configuration of the VCO of the A/D converter according to the first embodiment of the present invention.

FIG. 6 is a diagram illustrating a fourth example of the expanded portion D of the delay units in FIG. 2. FIG. 6 is different from FIG. 4 in that current sources I1 and I2 controlling the delay amounts of the delay units DU0 to DU8 are inserted to the power line of the fully differential inversion elements DE*_2 forming of the delay units DU0 to DU8. With such a configuration, the delay amount can be made to be varied, and thus a feedback process such as a process of operating the VCO 101 in synchronization with another clock can be performed. The case has been described in which the current sources are inserted to the power line of the fully differential inversion elements DE*_2, but the present invention is not limited thereto.

As described above, the low-order logic state of the delay units DU0 to DU8 forming the VCO 101 is retained in the low-order latch unit 105 and the high-order logic state of the count unit 103 to which the logic state of the delay unit DU8 is input is retained in the high-order latch unit 107. Thus, since the high-order logic state and the low-order logic state are each varied in synchronization with the same start pulse (StartP) and a phase relation between the high-order logic state and the low-order logic state is retained, the above-described problem (1) can be resolved.

Figure 15:
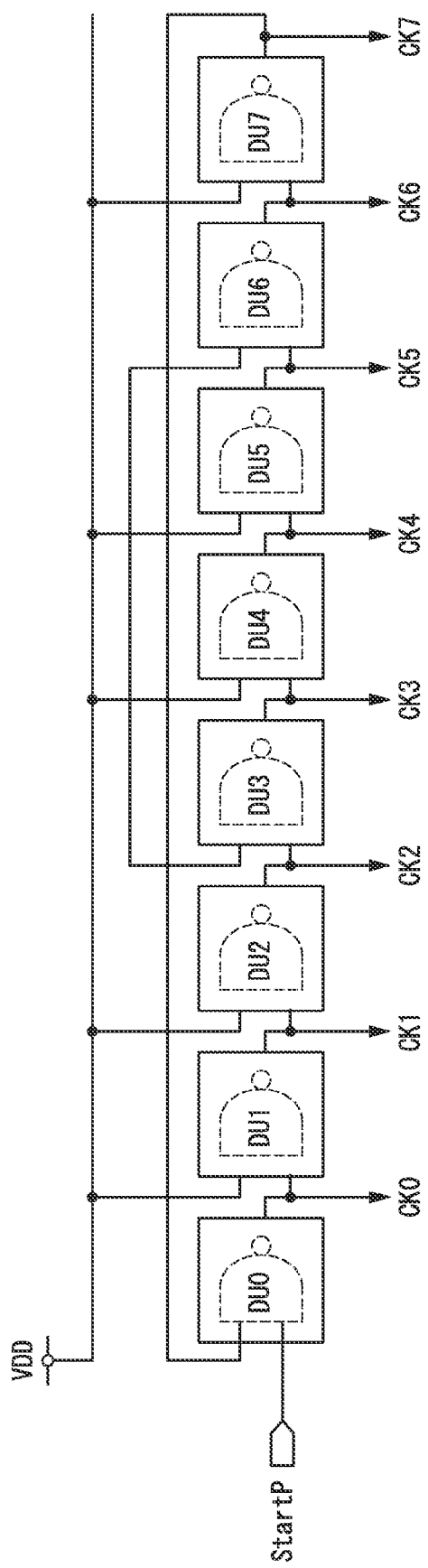
FIG. 15 is a block diagram illustrating the partial configuration of the VCO of the A/D converter according to the first embodiment of the present invention.

In this configuration, the case has been described in which the ring delay circuit is configured by a VCO (Voltage Controlled Oscillator) circuit which is a symmetric oscillation circuit. However, as in the symmetric oscillation circuit, the ring delay circuit itself is configured by odd number of delay units and an asymmetric oscillation circuit in which the outputs are equivalently even (particularly, power-of-two) may be used. Further, the ring delay circuit itself shown in FIG. 15 may be formed by even (particularly, power-of-two) delay units, an RDL (Ring Delay Line) circuit or a ring delay circuit in which the outputs (terminals) in the low-order logic state is even may be formed by even (particularly, power-of-two) delay units, and a so-called fully differential oscillation circuit may be used in which the outputs of the final stage of the fully differential inversion circuit forming the delay unit are returned to the reverse side of the inputs of the initial stage.

Figure 7:
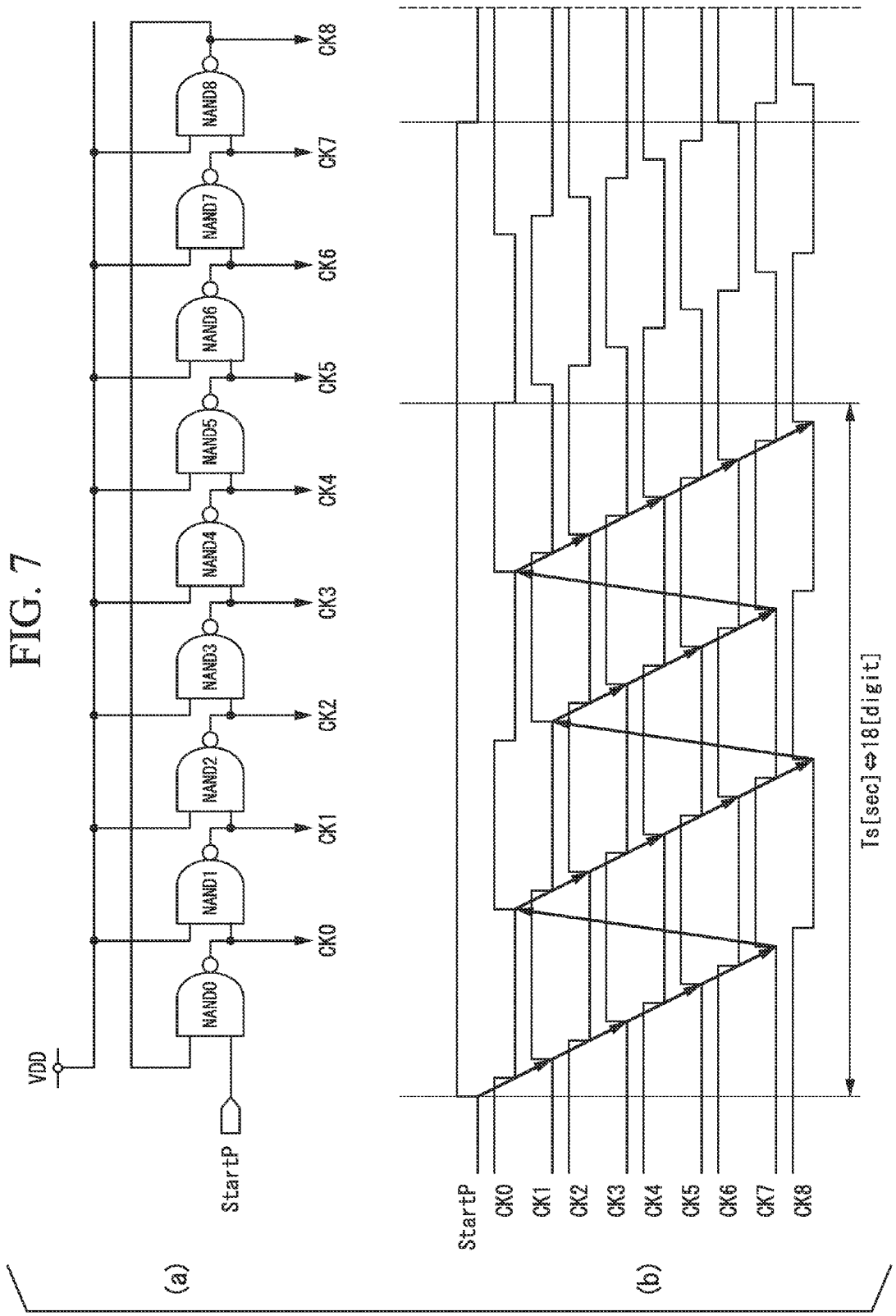
FIG. 7 is a diagram illustrating the configuration of the low-order logic state of the VCO of the A/D converter and a timing chart of a process of detecting the low-order logic state of the VCO according to the first embodiment of the present invention.

Next, a process of detecting the low-order logic state of the VCO 101 will be described. FIG. 7 is a diagram illustrating the process of detecting the low-order logic state. The configuration (part (a)) and the timing chart (part (b)) are shown. Hereinafter, the configuration shown part (a) of FIG. 7 will be described. The VCO 101 has a configuration in which delay units are connected to each other to form nine stages. The output terminals of the delay units DU0 to DU8 output signals CK0 to CK8 regarding the states of the delay unit being operating, respectively. The delay units DU0 to DU8 are configured by NAND circuits (NAND0 to NAND8), respectively. One terminal of each of the NAND circuits (NAND1 to NAND8) is connected to a power source VDD.

Next, the process shown in part (b) of FIG. 7 will be described. When the logic state of the start pulse (StartP) is changed from Low to High, the transition process of the VCO 101 is started and an inversion process of the signals CK0 to CK8 at a given time interval is repeated. That is, the states of the delay units in the VCO 101 are sequentially changed (transitioned). Here, the calculation unit 117 classifies the state output (=signal groups) of the VCO 101 into a first signal group (CK1, CK3, CK5, and CK7) and a second signal group (CK0, CK2, CK4, CK6, and CK8) and rearranges the signal groups. Specifically, CK1, CK3, CK5, CK7, CK0, CK2, CK4, CK6, and CK8 are rearranged. Thus, the signal groups sequentially rise at the given time interval (or fall at the given time interval), as indicated by arrows in part (b) of FIG. 7.

Subsequently, the transition position of the retained data is detected at a timing related to the end of the comparison process. Further, the transition position is a position at which the rearranged signal group is changed from Low to High (or from High to Low). For example, in part (b) of FIG. 7, the logic state of the start pulse (StartP) is changed from Low to High, and then the state output of the VCO 101 after Ts seconds is changed into Low (CK1), Low (CK3), Low (CK5), Low (CK7), High (CK0), High (CK2), High (CK4), High (CK6), and High (CK8), so that the CK0 becomes the transition position. In the rearranged signal group, the transition position at which the state is changed from Low to High (or from High to Low) is sequentially moved over time.

A circuit detecting the transition position uses substantially the same method as, for example, a flash type ADC. For example, the transition position can be detected by setting, as the transition position, a position at which the state is changed from Low to High (or High to Low). Since the transition position can be detected by setting one of rising and falling of a signal as a reference, the above-described problem (2) can be resolved. In this example, obtainable data of the low-order bits is data of power-of-two. However, when synthesized data of the high-order bits and the low-order bits is obtained by power-of-two, although not described in detail, the data can be easily converted into the data of power-of-two by a simple calculation process such as addition and subtraction or bit shift. Further, this process is not necessary in the above-described asymmetric oscillation circuit or the like in which the outputs are equivalently power-of-two.

Figure 8:
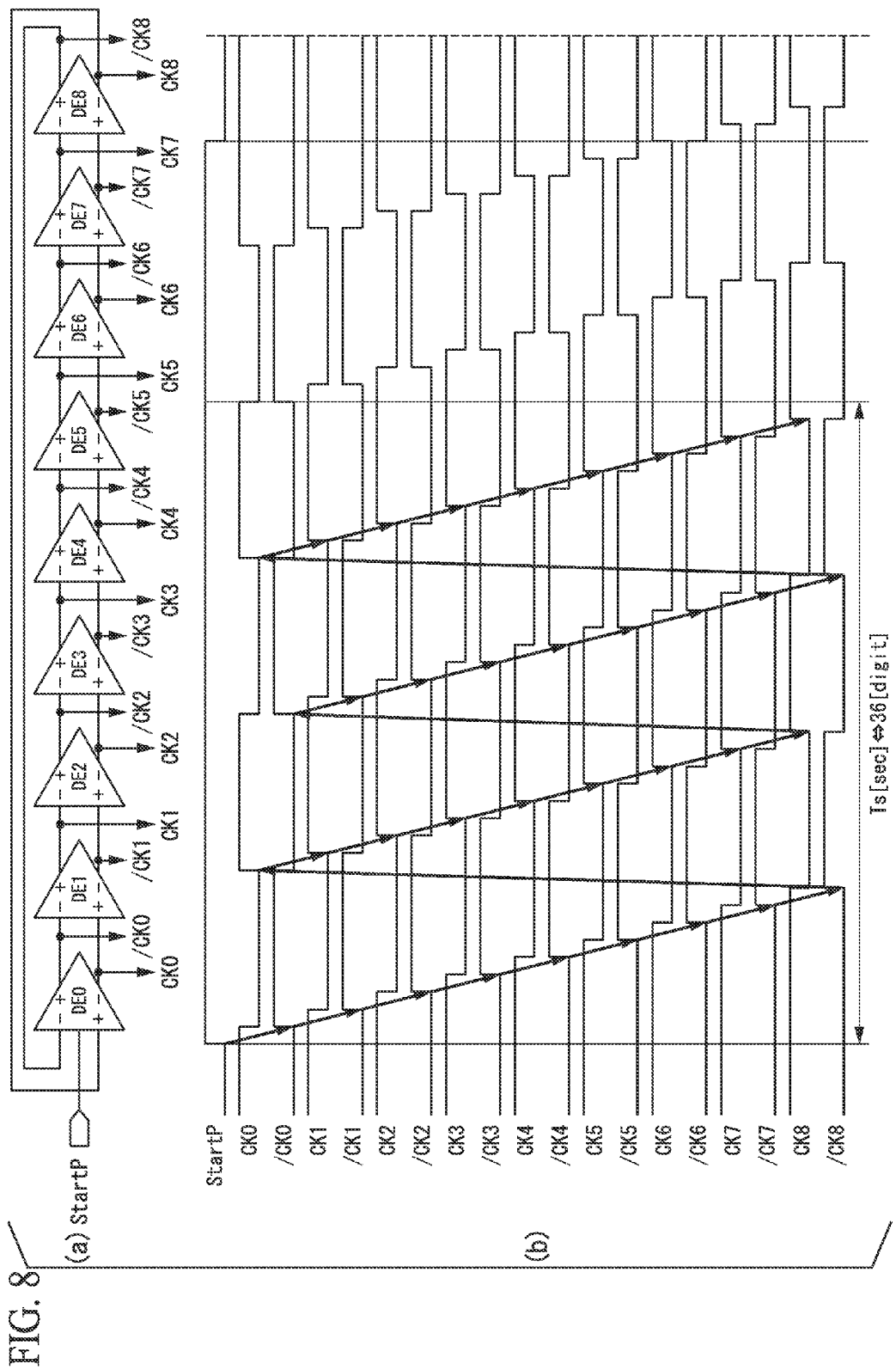
FIG. 8 is a diagram illustrating the configuration of the low-order logic state of the VCO of the A/D converter and a timing chart of a process of detecting the low-order logic state of the VCO according to the first embodiment of the present invention.

Next, another example of the process of detecting the low-order logic state of the VCO 101 will be described. FIG. 8 is a diagram illustrating the process of detecting the low-order logic state. The configuration (part (a)) and the timing chart (part (b)) are shown. Hereinafter, the configuration shown part (a) of FIG. 8 will be described. The VCO 101 has a configuration in which delay units are connected to each other to form nine stages. The output terminals of the delay units DU0 to DU8 output signals CK0 to CK8 and /CK0 to /CK8 regarding the states of the delay unit being operating, respectively. The delay units DU0 to DU8 are configured by fully differential inversion elements (DE0 to DE8), respectively.

Next, the process shown in part (b) of FIG. 8 will be described. When the logic state of the start pulse (StartP) is changed from Low to High, the oscillation of the VCO 101 is started and a process of inverting the signals CK0 to CK8 and /CK0 to /CK8 at a given time interval is repeated. That is, the states of the delay units in the VCO 101 are sequentially changed (transitioned). Here, the calculation unit 117 classifies the state (=signal groups) of the VCO 101 into a first signal group (/CK0 to /CK8) and a second signal group (CK0 to CK8) and rearranges the signal groups. Specifically, /CK0, /CK1, /CK2, /CK3, /CK4, /CK5, /CK6, /CK7, /CK8, CK0, CK1, CK2, CK3, CK4, CK5, CK6, CK7, and CK8 are rearranged. Thus, the signal groups sequentially rise at the given time interval (or falls at the given time interval), as indicated by arrows in part (b) of FIG. 8.

Subsequently, the transition position of the retained data is detected at a first timing related to the end of the comparison process. The transition position is detected by substantially the same as a flash type ADC. Thus, the above-described problem (2) can be resolved. In this example, obtainable data of the low-order bits is not data of power-of-two. Therefore, when synthesized data of the high-order bits and the low-order bits is obtained by power-of-two, although not described in detail, the data can be easily converted into the data of power-of-two by a simple calculation process such as addition and subtraction or bit shift. Further, this process is not necessary in the above-described fully differential oscillation circuit or the like that includes power-of-two delay units.

In FIG. 7, the delay unit is configured by the NAND circuit. When attention is paid to an output of one delay unit, one of High and Low can be obtained as a logic state. On the other hand, in FIG. 8, the delay unit is configured by the fully differential inversion element. Therefore, when attention is paid to one delay unit, both High and Low can be obtained as logic states. When only the change in the rising position of the signal is followed, the rising position moves faster in part (b) of FIG. 8 than in part (b) of FIG. 7, as indicated by the inclination of the arrows in part (b) of FIG. 7 and part (b) of FIG. 8. That is, the change in the transition position of the low-order logic state is faster in the configuration shown in part (a) of FIG. 8 than in the configuration shown in part (a) of FIG. 7, and thus a high-speed process can be performed.

Figure 9:
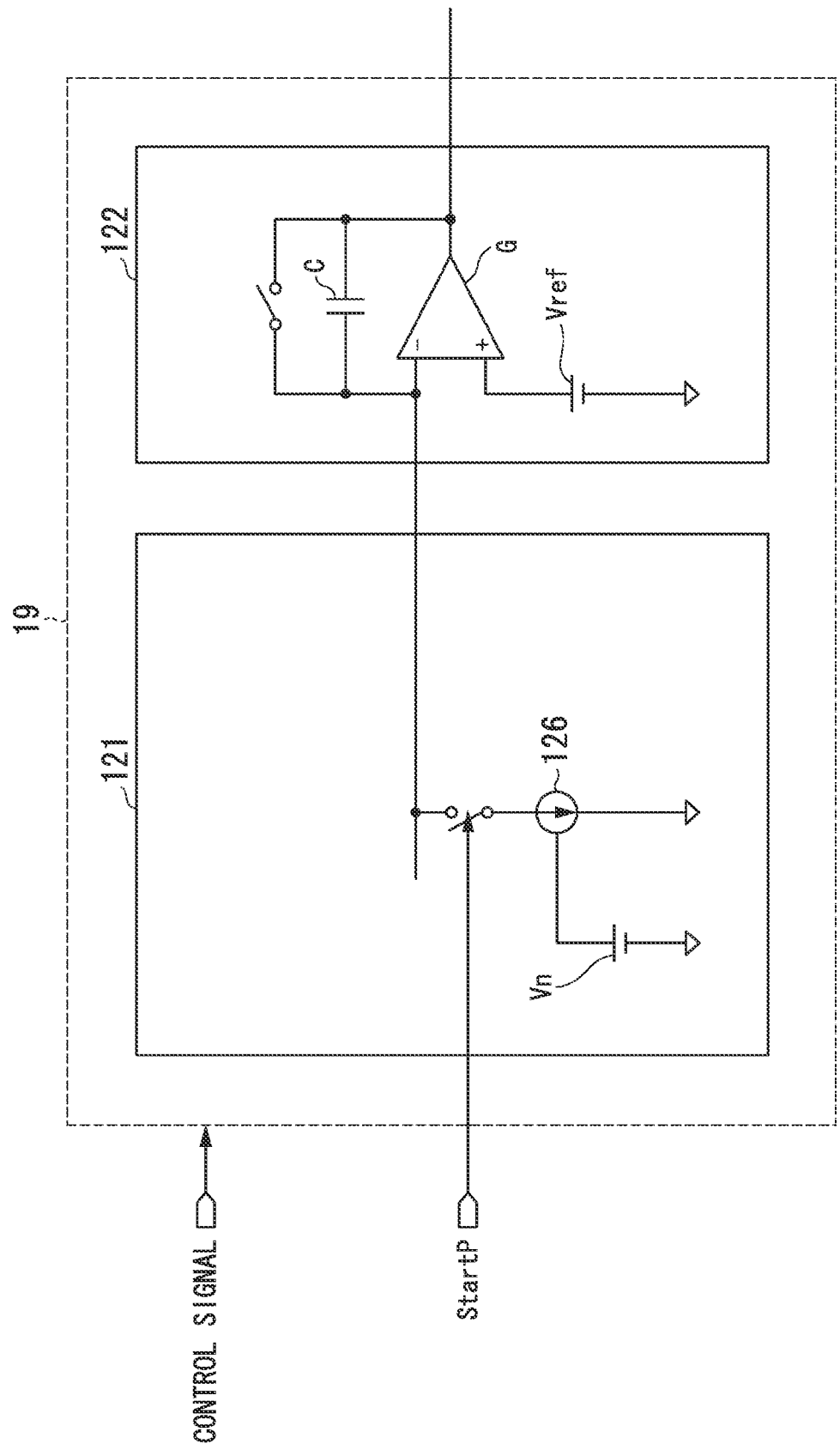
FIG. 9 is a diagram illustrating the configuration of a ramp unit of the A/D converter according to the first embodiment of the present invention.

Next, an example of the configuration of the ramp unit 19 in FIG. 1 will be described. FIG. 9 shows a first example of the configuration of the ramp unit 19. As illustrated in the drawing, the ramp unit 19 includes a charge supply circuit 121 and an integration circuit 122. The charge supply circuit 121 is configured to generate a constant charge at a constant time interval. In this case, one end of the charge supply circuit 121 is connected to a ground GND and the charge supply circuit 121 includes a variable current source 126, which is connected to an input of the integration circuit 122, at the other end. The variable current source 126 is configured such that its current value is varied. Therefore, by varying the current value of the variable current source 126, a desired inclination can be obtained as the inclination of a ramp wave output from the integration circuit 122. The integration circuit 122 is configured to accumulate charge generated from the charge supply circuit 121 and change the charge into voltage. In this case, the integration circuit 122 includes a capacitor C, a voltage source Vref, and a calculation amplifier G. One end of the voltage source Vref is connected to the ground GND and the other end of the voltage source Vref is connected to a positive (+) input terminal of the calculation amplifier G Further, by configuring the voltage source Vref as a variable voltage source, the initial value (start voltage) of the ramp wave can be made to be a desired value.

Figure 10:
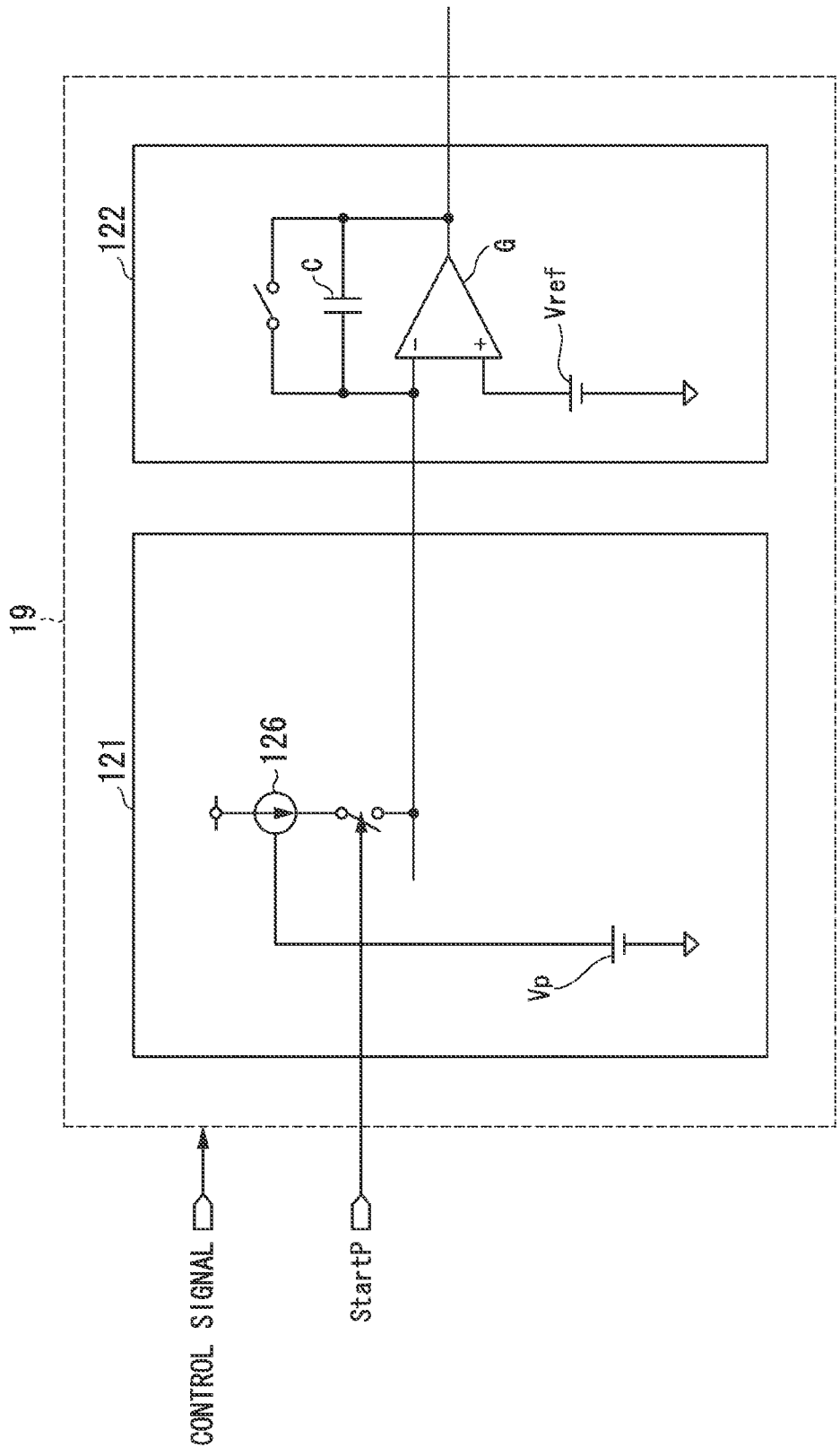
FIG. 10 is a diagram illustrating the configuration of the ramp unit of the A/D converter according to the first embodiment of the present invention.

FIG. 10 is a diagram illustrating a second example of the configuration of the ramp unit 19. FIG. 10 is different from FIG. 9 in that one end of the variable current source 126 of the charge supply circuit 121 is connected to a reference power source.

Figure 11:
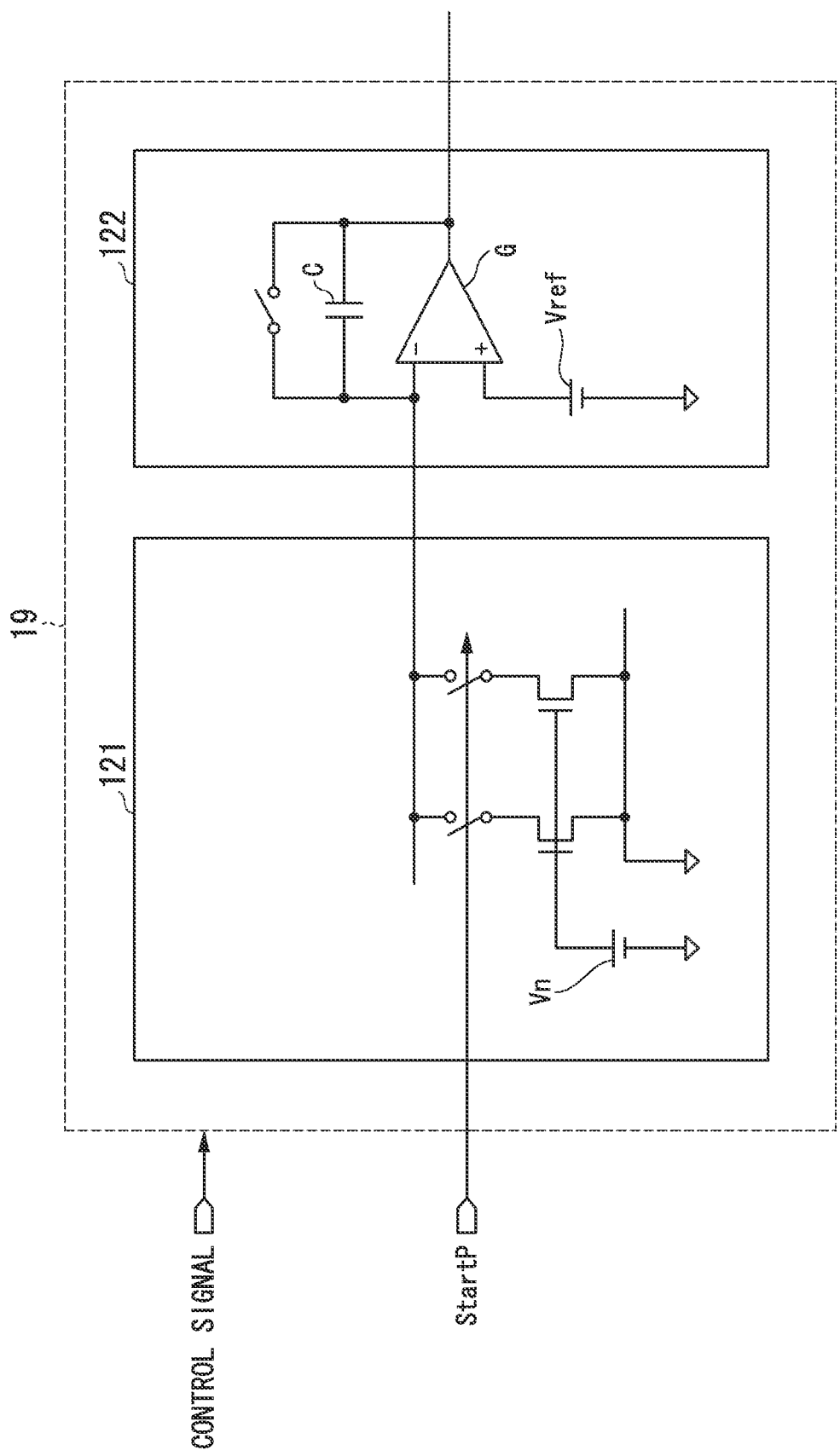
FIG. 11 is a diagram illustrating the configuration of the ramp unit of the A/D converter according to the first embodiment of the present invention.

FIG. 11 is a diagram illustrating a third example of the configuration of the ramp unit 19. FIG. 11 is different from FIG. 9 in that the variable current source includes a plurality of NMOS transistors. A ramp wave with a desired inclination can be obtained by varying the voltage of a voltage source Vn to be applied to a gate electrode of the NMOS transistor and the number of transistors.

Figure 12:
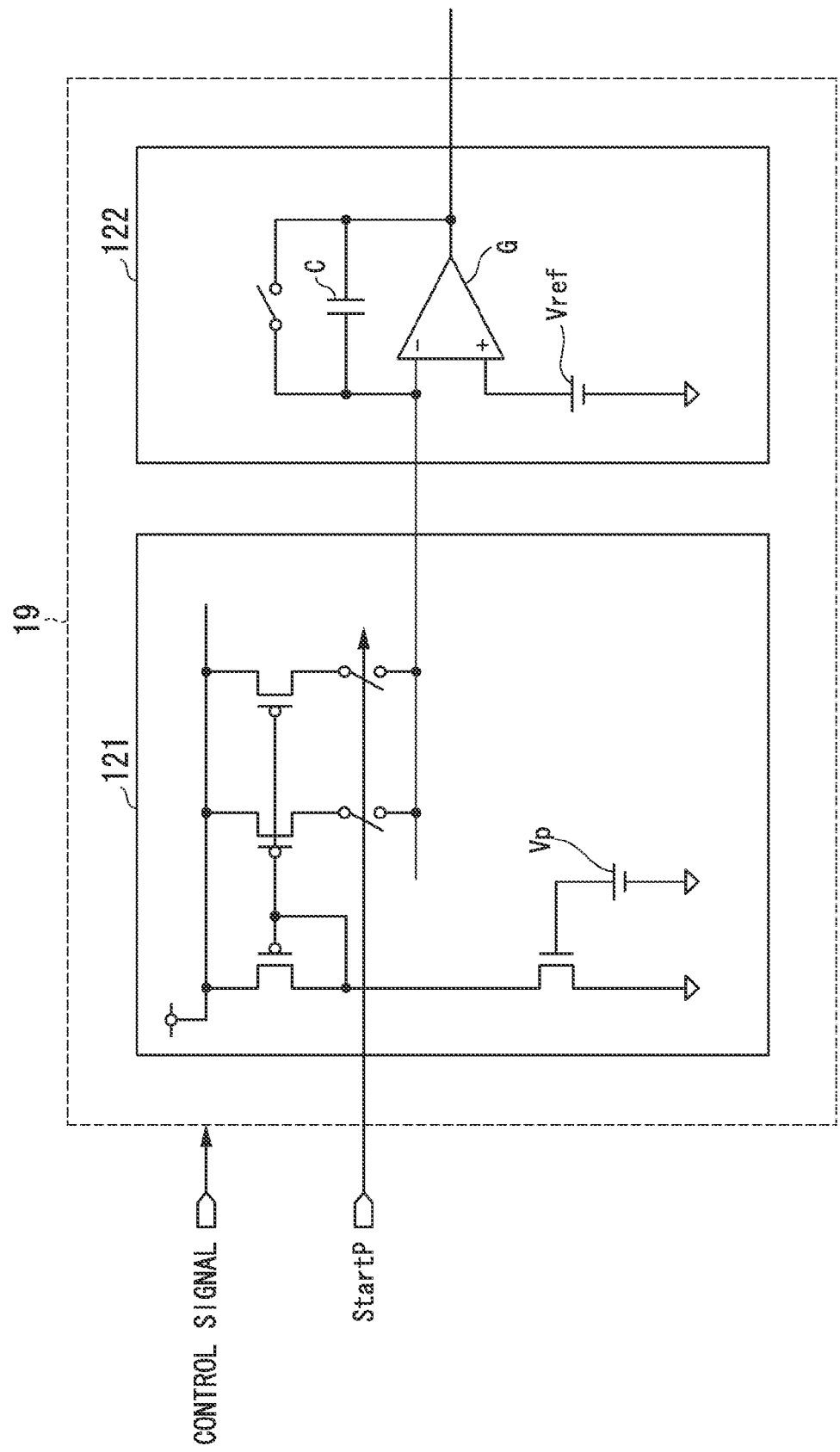
FIG. 12 is a diagram illustrating the configuration of the ramp unit of the A/D converter according to the first embodiment of the present invention.

FIG. 12 is a diagram illustrating a fourth example of the configuration of the ramp unit 19. FIG. 12 is different from FIG. 10 in that the variable current source includes a plurality of PMOS transistors. As in FIG. 11, a ramp wave with a desired inclination can be obtained by varying the voltage of a voltage source Vp to be applied to a gate electrode of the NMOS transistor and the number of transistors.

Figure 13:
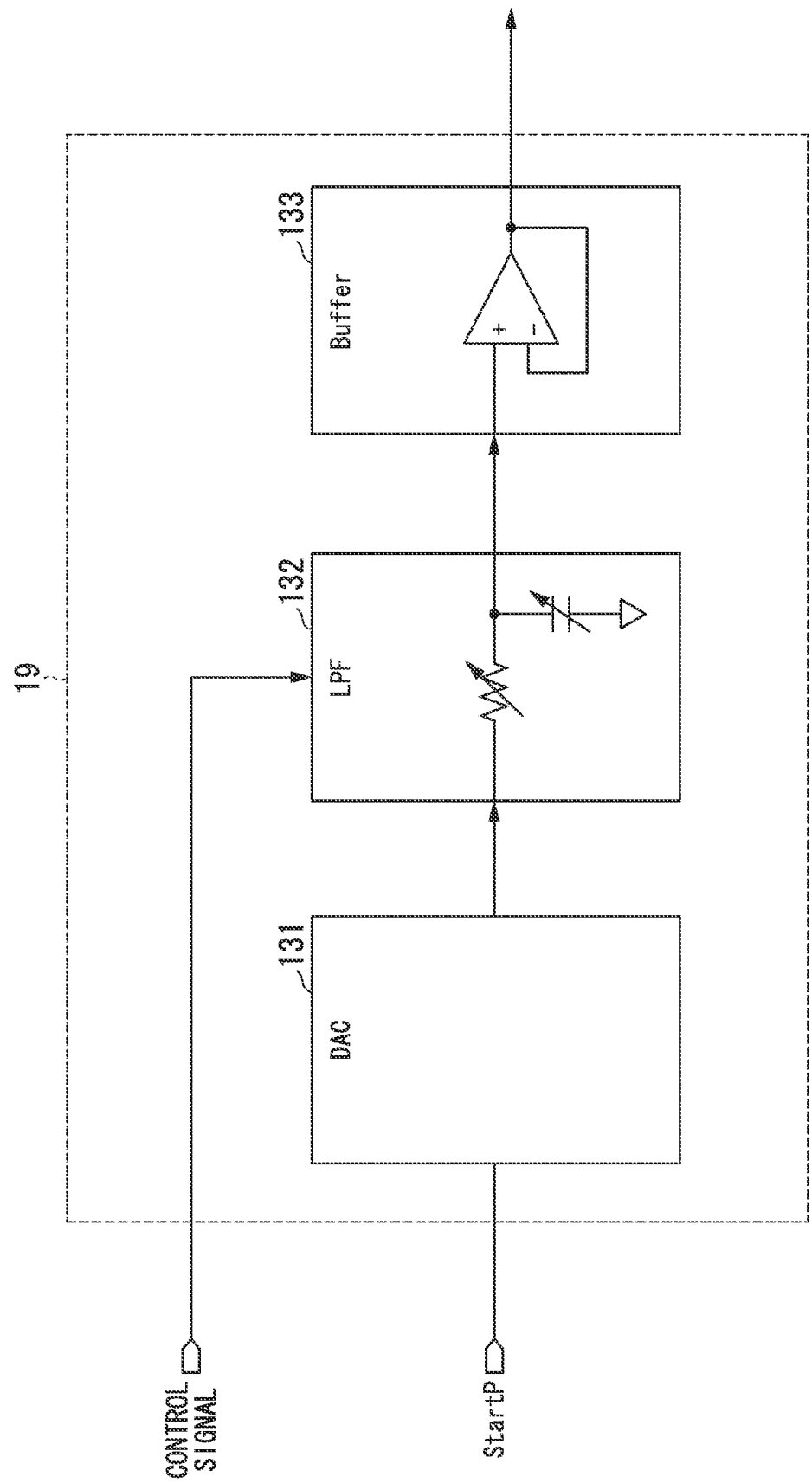
FIG. 13 is a diagram illustrating the configuration of the ramp unit of the A/D converter according to the first embodiment of the present invention.

FIG. 13 is a diagram illustrating a fifth example of the configuration of the ramp unit 19. As illustrated in the drawing, the ramp unit 19 includes a DAC (Digital Analog Converter) circuit 131, an LPF (Low Pass Filter) circuit 132, and a buffer circuit 133. The DAC circuit 131 generates a step-shaped ramp wave, for example, in accordance with an increase in the count value of the count unit 103. The LPF circuit 132 is a low-frequency pass filter circuit that includes, for example, a resistor and a capacitor. A band ($\approx 1/\tau$: time constant $\tau R \times C$) is controlled by varying the resistant value R and the capacitance value C which are filter constants. The present invention is not limited to this configuration of the filter circuit. The buffer circuit 133 buffers and outputs the ramp wave passing through the LPF circuit 132. Further, the buffer circuit 133 may be configured by a source follower circuit, a voltage follower circuit, or an amplifier capable of amplifying a voltage.

Figure 14:
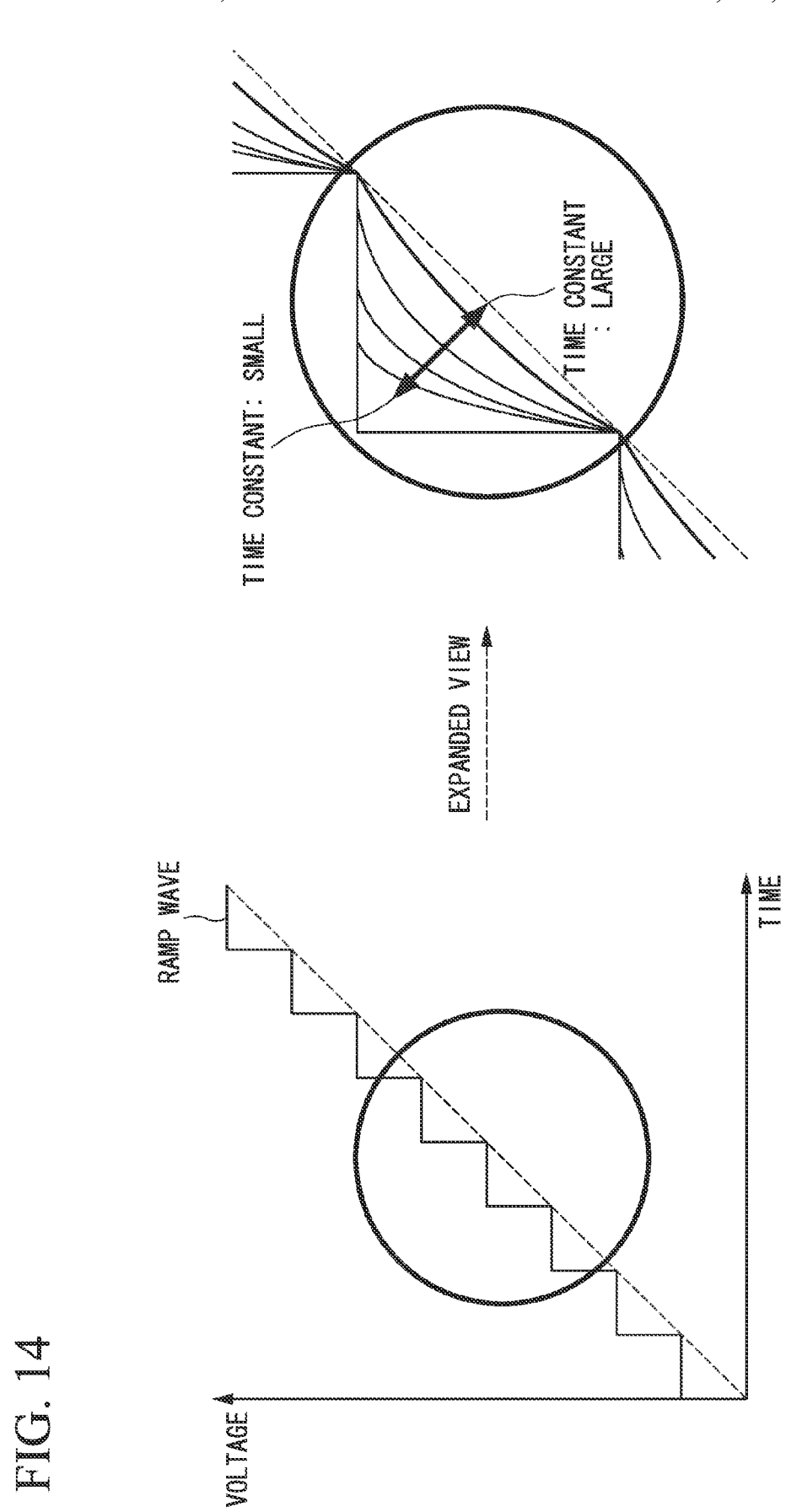
FIG. 14 is a reference diagram illustrating control of a ramp wave in the ramp unit of the A/D converter according to the first embodiment of the present invention.

FIG. 14 is a diagram schematically illustrating a case where the filter constant of the LPF circuit 132 in FIG. 13 is varied. The horizontal axis represents a time and the vertical axis represents a voltage. The ramp waveform is varied by controlling the filter constant.

Next, control of the ramp wave will be described in detail. The time of the horizontal axis in FIG. 14 is identical to a delay amount (time) of a delay unit and the voltage of the vertical axis is identical to a quantization step of the DAC circuit 131. For example, in regard to the variation in the delay amount of the delay unit, control is performed such that a band is increased when the delay amount is decreased, whereas the band is decreased when the delay amount is increased. For example, in regard to the variation in the quantization step of the DAC circuit, the control is performed such that the band is decreased when the quantization step is decreased, whereas the band is increased when the quantization step is increased. In this way, the smooth ramp wave can be obtained by providing the filter and controlling the filter constant.

In this embodiment, as described above, since the control of the high-order bits is completely dependent on the control of the low-order bits in principle, miscode is not generated due to the phase deviation between the high-order bits and the low-order bits. Further, encoding can be performed only by rising or falling by detecting the transition position from Low to High or from High to Low in the signal group in which the signals indicating the low-order logic state of the VCO 101 are rearranged. Therefore, an encoding error can be prevented from being generated.

By configuring the VCO 101 by odd delay units, high DNL (Differential Non Linearity) can be ensured and oscillation can be easily achieved. Further, by configuring one delay unit by an odd number of one or more inversion elements, the circuit configuration of the inversion element of the delay unit can be diversified. Furthermore, by configuring the VCOs 101 by the odd number of the fully differential inversion circuits, the ring delay circuit can be operated at high speed.

By setting the delay amount of the delay unit so as to be controlled, it is possible to perform the feedback control such as a process of synchronizing the VCO 101 with another clock. Further, by controlling the delay amounts of the plurality of delay units such that the current flowing in the delay units is variable, the feedback control can be achieved with a simply configuration.

By configuring the ramp unit 19 by the integration circuit, a reference signal (ramp wave) is converted into an analog signal, thereby realizing the high resolution and the high accurate A/D conversion. Further, by configuring the ramp unit 19 by the DAC circuit, the reference signal becomes a digital signal, thereby improving the noise tolerance thereof.

By providing the LPF circuit in the rear stage of the DAC circuit in the ramp unit 19, a digital reference signal can be changed into an analog reference signal. Further, by controlling the filter constant of the LPF circuit in accordance with the delay amount of the delay unit and the quantization step of the DAC circuit, a digital reference signal can be made to be optimum to an analog reference signal in accordance with the driving state, thereby obtaining the reference signal varying more smoothly.

Since the A/D converter includes no means for detecting a change in power voltage or a change in temperature and controlling the circuit, an increase in the power consumption and the size of the circuit can be prevented.

Second Embodiment

Figure 16:
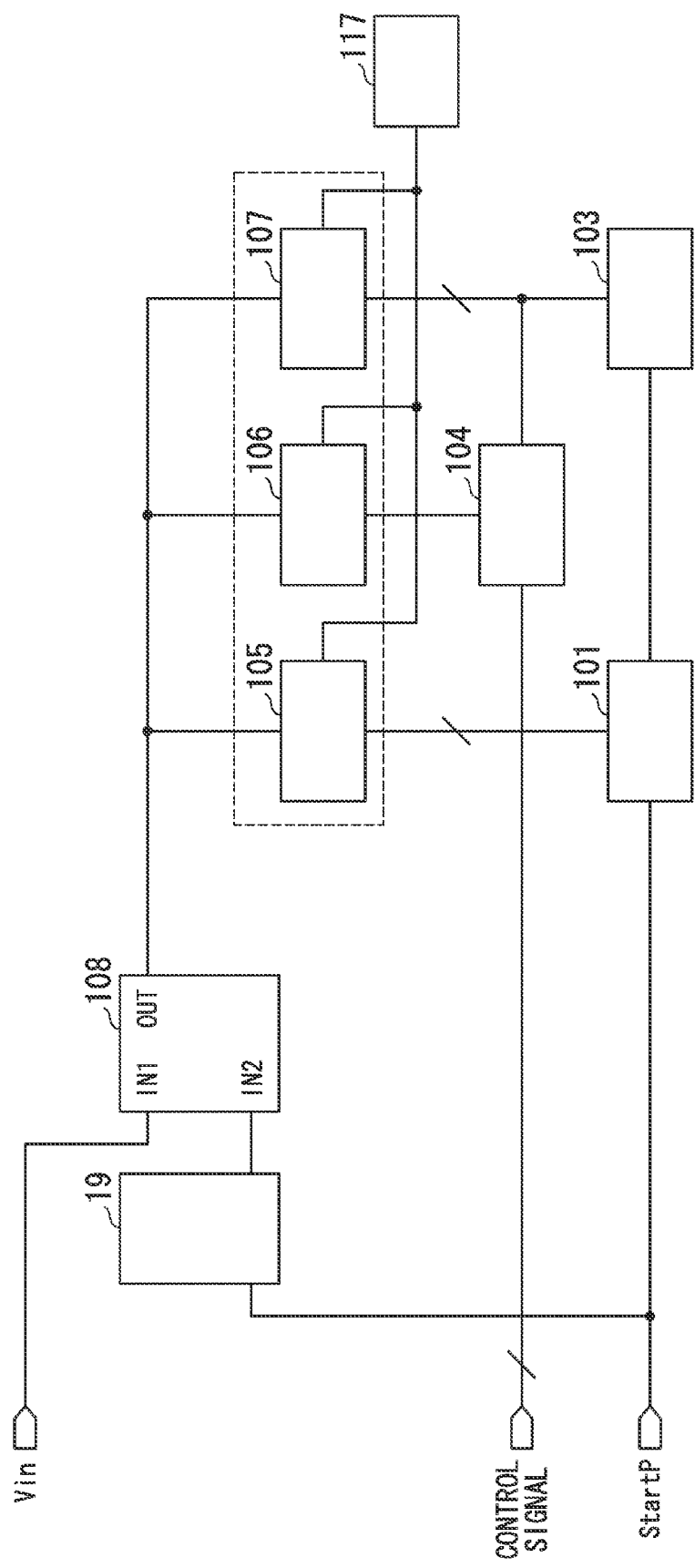
FIG. 16 is a block diagram illustrating the configuration of an A/D converter according to a second embodiment of the present invention.

FIG. 16 is a diagram illustrating an example of the overall configuration of an A/D converter according to a second embodiment of the present invention. Hereinafter, the configuration shown in FIG. 16 will be described. FIG. 16 is different from FIG. 1 in that a count delay unit 104 is provided to delay the output of the high-order logic state from the count unit 103 and a redundant high-order latch unit 106 is provided. The count delay unit 104 is controlled by a control signal. The high-order logic state output from the count unit 103 is delayed by the count delay unit 104 and is retained in the redundant high-order latch unit 106. Since the remaining configuration is the same as that shown in FIG. 1, the description thereof will not be repeated here.

Accordingly, the high-order logic state and a redundant high-order logic state delayed from the high-order logic state can be output. Therefore, for example, even when a timing at which the data is retained is deviated (mismatched) between the low-order logic state and the high-order logic state, the data can be corrected by using the data maintaining the redundant high-order logic state. In FIG. 16, the redundant high-order logic state is a state delayed from the high-order logic state. However, the high-order logic state may be a state delayed from the redundant high-order logic state.

Figure 17:
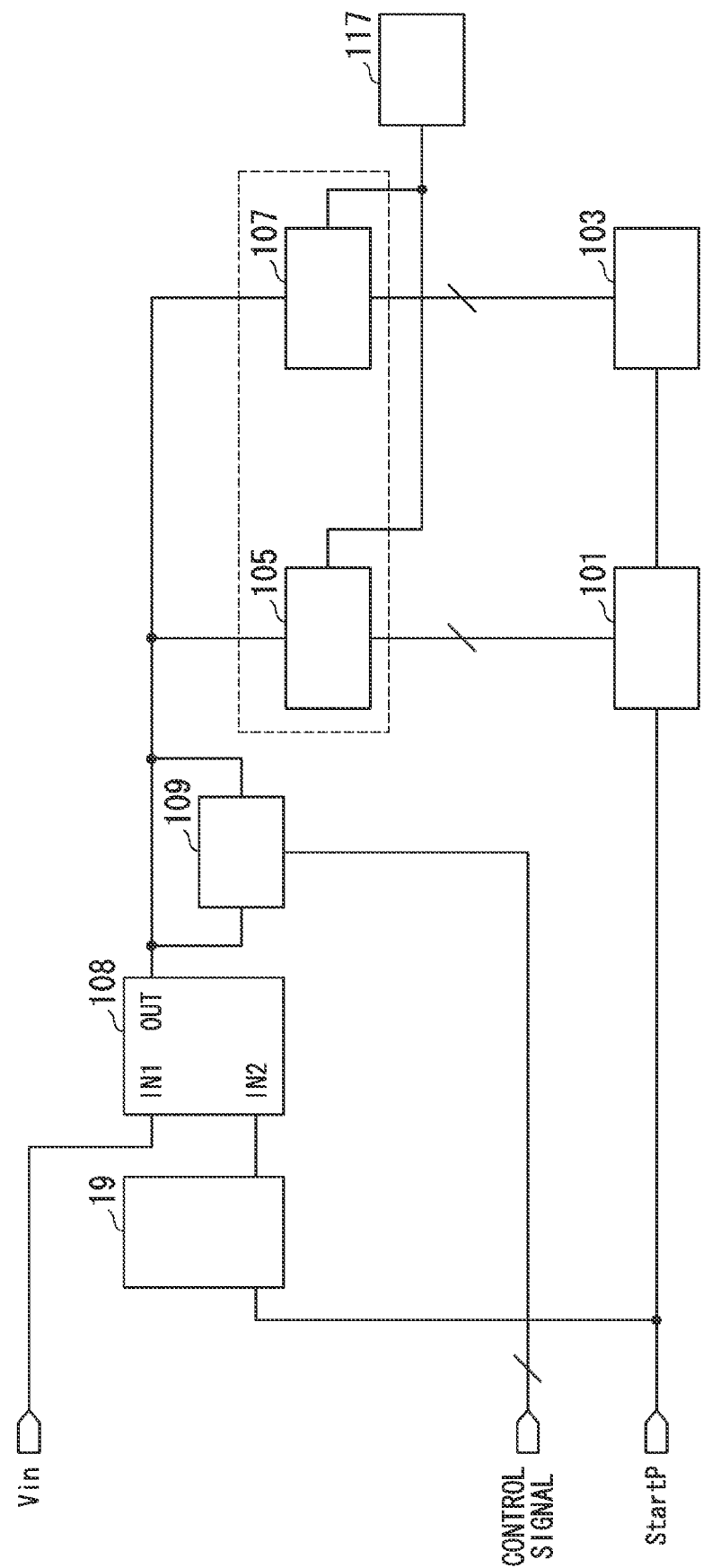
FIG. 17 is a block diagram illustrating the configuration of the A/D converter according to the second embodiment of the present invention.

FIG. 17 is a diagram illustrating a second example of the overall configuration of an A/D converter according to this embodiment of the present invention. Hereinafter, the configuration shown in FIG. 17 will be described. FIG. 17 is different from FIG. 1 in that a comparison delay unit 109 is provided to delay a comparison result from the comparison unit 108. The comparison delay unit 109 is controlled by a control signal. A latch timing of the low-order latch unit 105 is controlled by one of a signal output from the comparison unit 108 and a signal output from a comparison delay unit 109 and a latch timing of the high-order latch unit 107 is controlled by the other thereof. Since the remaining configuration is the same as that shown in FIG. 1, the description thereof will not be repeated.

Accordingly, an input timing can be made to be suitable, for example, by controlling the timings at which the low-order logic state from the VCO 101 and the high-order logic state from the count unit 103 are maintained.

Figure 18:
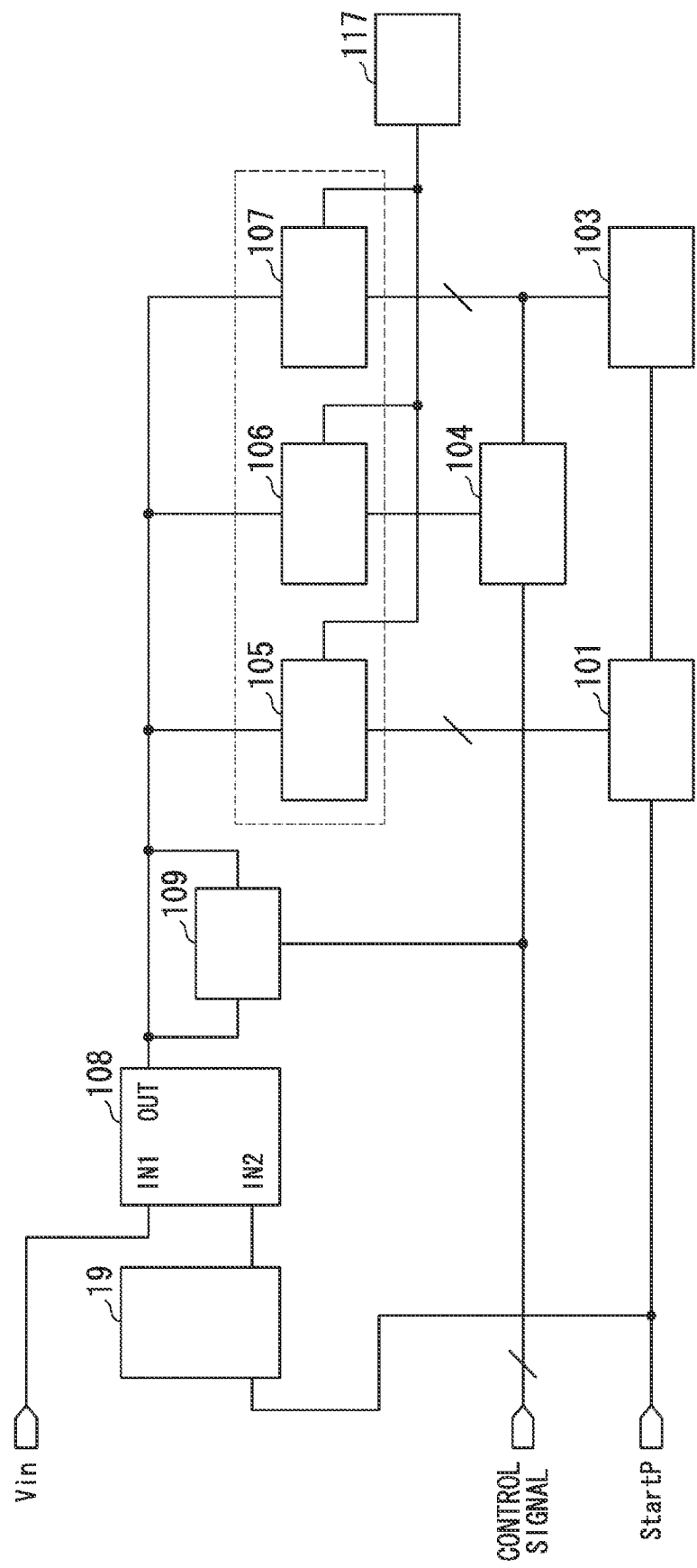
FIG. 18 is a block diagram illustrating the configuration of the A/D converter according to the second embodiment of the present invention.

FIG. 18 is a diagram illustrating a third example of the overall configuration of an A/D converter according to this embodiment of the present invention. Hereinafter, the configuration shown in FIG. 18 will be described. FIG. 18 is different from FIG. 1 in that a count delay unit 104 is provided to delay the output of the high-order logic state from the count unit 103, a redundant high-order latch unit 106 is provided, and a comparison delay unit 109 is provided to delay a comparison result from the comparison unit 108. The count delay unit 104 and the comparison delay unit 109 are controlled by a control signal. Since the remaining configuration is the same as that shown in FIG. 1, the description thereof will not be repeated here.

An input timing between bits can be made to be more suitable by controlling the data retaining timing of the low-order latch unit, the high-order latch unit, and the redundant high-order latch unit.

Third Embodiment

Figure 19:
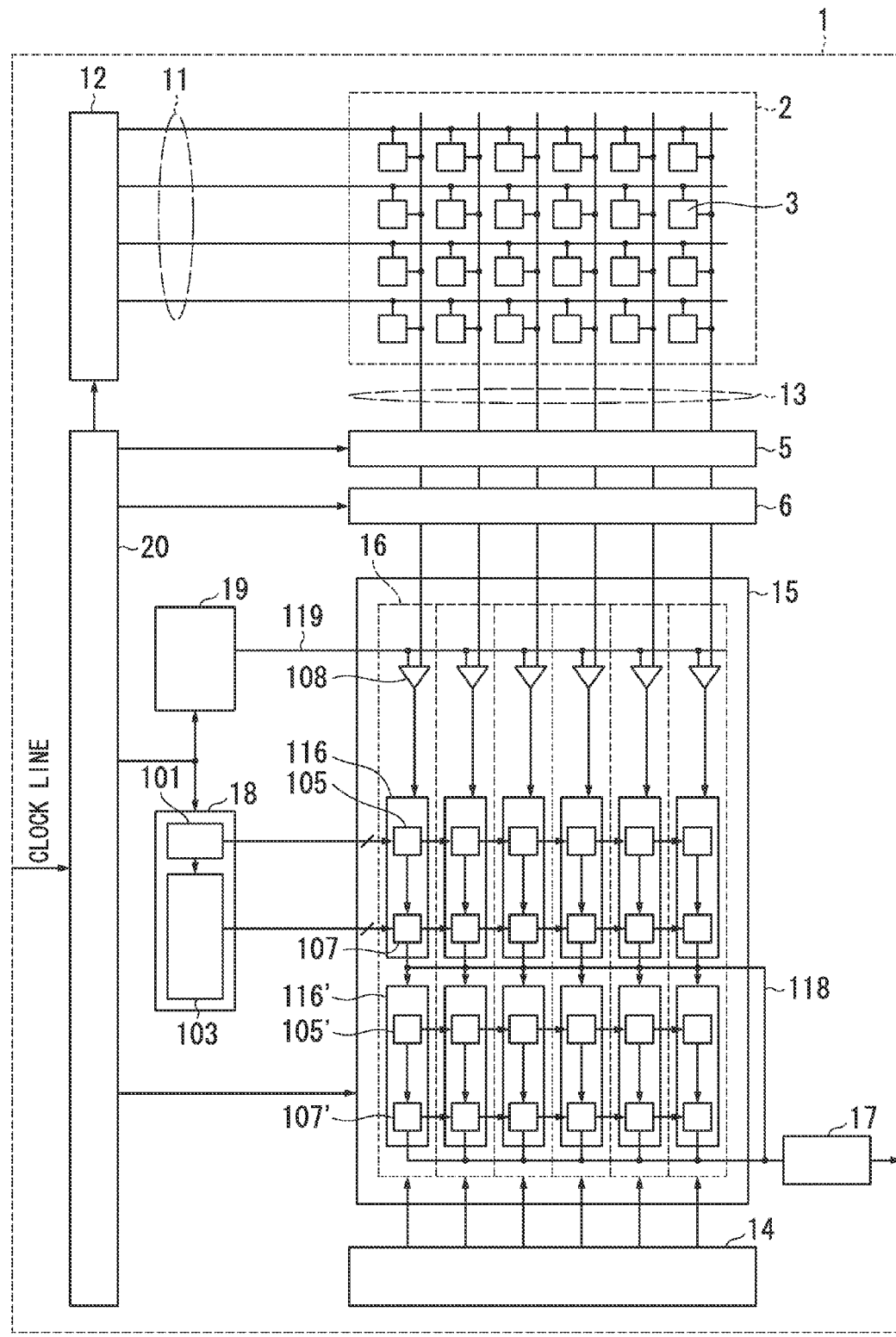
FIG. 19 is a block diagram illustrating the configuration of a solid-state imaging apparatus according to a third embodiment of the present invention.

FIG. 19 is diagram illustrating an example of the overall configuration of a (C)MOS solid-state imaging apparatus according to a third embodiment of the present invention. Hereinafter, the configuration shown in FIG. 19 will be described. A solid-state imaging apparatus 1 includes an imaging unit 2, a vertical selection unit 12, a read current source unit 5, an analog unit 6, a clock generation unit 18, a ramp unit 19, a column processing unit 15, a horizontal selection unit 14, an output unit 17, and a control unit 20.

In the imaging unit 2, a plurality of unit pixels 3 generating and outputting a signal corresponding to the amount of an incident electromagnetic wave are arranged in a matrix form. The vertical selection unit 12 selects each row of the imaging unit 2. The read current source unit 5 reads a signal from the imaging unit 2 as a voltage signal. The analog unit 6 will not be described in detail. The analog unit 6, which includes an AGC (Auto Gain Control) circuit having a signal amplification function, as necessary. The clock generation unit 18 generates each clock. The ramp unit 19 generates a reference signal (ramp wave) increased and decreased over time. The column processing unit 15 is connected to the ramp unit 19 via the reference signal line 119. The horizontal selection unit 14 reads the data subjected to the A/D conversion to a horizontal signal line 118. The output unit 17 is connected to the horizontal signal line 118. The control unit 20 controls each unit.

In FIG. 19, the imaging unit 2 including the unit pixels 3 of four rows by six columns is illustrated to facilitate the description. In effect, the tens to tens of thousands of unit pixels 3 are arranged in each row or each column of the imaging unit 2. Although not illustrated in the drawing, each unit pixel 3 of the imaging unit 2 includes photoelectric conversion elements such as a photodiode, a photogate, and a phototransistor and a transistor circuit.

In the system configuration, a peripheral driving system or a signal processing system controlling driving of the respective unit pixels 3 of the imaging unit 2, that is, peripheral circuits such as the vertical selection unit 12, the horizontal selection unit 14, the column processing unit 15, the output unit 17, the clock generation unit 18, the ramp unit 19, and the control unit 20, are integrally formed together with the imaging unit 2 in a semiconductor region such as a monocrystalline silicon by a technique such as a technique of manufacturing a semiconductor integrated circuit.

Hereinafter, each unit will be described in more detail. In the imaging unit 2, the unit pixels 3 are arranged two-dimensionally in four rows by six columns and a row control line 11 is disposed for each row of the pixel arrangement of four rows by six columns. One end of each row control line 11 is connected to an output end of corresponding to each row of the vertical selection unit 12. The vertical selection unit 12 is configured by a shift resistor, a decoder, or the like. When the respective unit pixels 3 of the imaging unit 2 are driven, the vertical selection unit 12 controls a row address or row scanning of the imaging unit 2 via the row control line 11. A vertical signal line 13 is disposed for each column of the pixel arrangement of the imaging unit 2.

Figure 20:
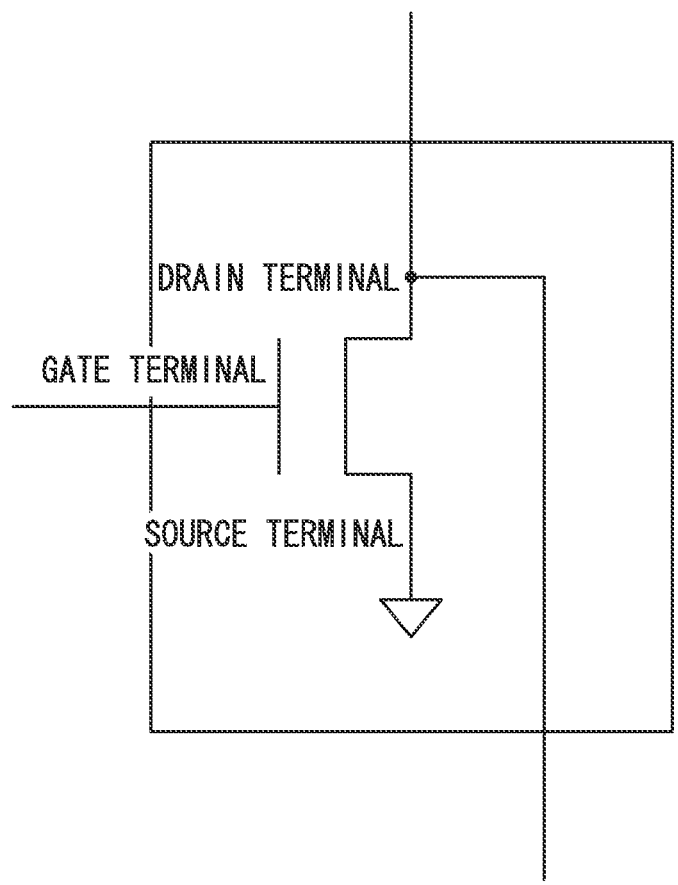
FIG. 20 is a diagram illustrating the configuration of a read current source of the solid-state imaging apparatus according to the third embodiment.

FIG. 20 is a diagram illustrating an example of the read current source unit 5. The read current source unit 5 is configured by an NMOS transistor. The vertical signal line 13 from the imaging unit 2 is connected to a drain terminal, a suitable desired voltage is applied to a control terminal, a source terminal is connected to a GND. With such a configuration, a signal from a pixel is output as a voltage mode. In FIG. 20, the case has been described in which the NMOS transistor is used as the read current source unit 5, but the present invention is not limited thereto.

The column processing unit 15 includes an ADC units 16 installed in each pixel column of the imaging unit 2, that is, the vertical signal line 13 and converts an analog pixel signal, which is read for each pixel column from each unit pixel 3 of the imaging unit 2 via the vertical signal line 13, into digital data. In this example, the ADC unit 16 is installed so as to have a one-to-one arrangement relation with the pixel column of the imaging unit 2. However, this configuration is just an example and the present invention is not limited to this arrangement relation. For example, one ADC unit 16 may be installed for the plurality of pixel columns and the one ADC unit 16 may be used in a time division manner between the plurality of pixel columns Along with the ramp unit 19, the clock generation unit 18, the output unit 17 described below, the column processing unit 15 forms analog-to-digital conversion means for converting an analog pixel signal read from the unit pixels 3 of the selection pixel row of the imaging unit 2 into digital pixel data. The column processing unit 15, particularly, the ADC unit 16 will be described later in detail.

The ramp unit 19 is configured, for example, an integration circuit. Under the control of the control unit 20, the ramp unit 19 generates a so-called ramp wave of which a level is varied in an inclination shape over time and supplies the ramp wave to one input terminal of the comparison unit 108 via the reference signal line 119. The ramp unit 19 may be configured by a DAC circuit as well as the integration circuit. However, when the ramp wave is generated digitally by the use of the DAC circuit, it is necessary to set the step of the ramp wave in detail or to have the equivalent configuration.

The horizontal selection unit 14 is configured by, a shift resistor, a decoder, or the like and controls the column address or column scanning of the ADC unit 16 of the column processing unit 15. Under the control of the horizontal selection unit 14, the digital data subjected to the A/D conversion by the ADC unit 16 are sequentially read to the horizontal signal line 118.

The control unit 20 includes a functional block of a TG (Timing Generator) that supplies clocks necessary for the operation of each unit such as the ramp unit 19, the clock generation unit 18, the vertical selection unit 12, the horizontal selection unit 14, and the output unit 17 or pulse signals of a predetermined timing, and a function block that communicates with the TG Further, the control unit 20 may be provided as another semiconductor integrated circuit so as to be independent of other functional elements such as the imaging unit 2, the vertical selection unit 12, and the horizontal selection unit 14. In this case, an imaging apparatus which is an example of a semiconductor system, is constructed by the control unit 20 and an imaging device formed by the imaging unit 2, the vertical selection unit 12, and the horizontal selection unit 14. The imaging apparatus may be provided as an imaging module embedded with a peripheral signal process, a power circuit, or the like.

The clock generation unit 18 includes the VCO 101 and the count unit 103. For example, when the VCO 101 is configured as a nine-stage delay unit, the clock generation unit 18 outputs nine-phase clocks CK0, CK1, CK2, CK3, CK4, CK5, CK6, CK7, and CK8.

The output unit 17 has a calculation unit therein, performs code conversion such as binarization based on the output digital data, and outputs the binarized digital data. The output unit 17 may have signal processing functions such as black level adjustment, column variation correction, and color processing as well as a buffering function. Further, the output unit 17 may convert n-bit parallel digital data into serial data and output the serial data.

Next, the configuration of the ADC unit 16 will be described. Each ADC unit 16 generates a pulse signal having a magnitude (pulse width) corresponding to the magnitude of a reset level (reference level) or a signal level in a time axis direction by comparing the analog pixel signal read from each unit pixel 3 of the imaging unit 2 via the vertical signal line 13 to the ramp wave supplied from the ramp unit 19 and used for the A/D conversion. Then, the ADC unit 16 performs the A/D conversion by converting the data corresponding to a period of the pulse width of the pulse signal into digital data corresponding to the magnitude of the pixel signal.

Hereinafter, the configuration of the ADC unit 16 will be described in detail. The ADC unit 16 is installed in each column. In FIG. 19, six ADC units 16 are installed. The ADC units 16 in the columns have the same configuration. The ADC unit 16 includes the comparison unit 108, a first latch unit 116 including a first low-order latch unit 105 and a first high-order latch unit 107, and a second latch unit 116' including a second low-order latch unit 105' and a second high-order latch unit 107'.

The comparison unit 108 converts the magnitude of the pixel signal into information (the pulse width of the pulse signal) in the time axis direction by comparing the signal voltage corresponding to the analog pixel signal output from the unit pixel 3 of the imaging unit 2 via the vertical signal line 13 to the ramp wave supplied from the ramp unit 19. For example, the comparison output of the comparison unit 108 becomes a High level when the ramp voltage is greater than the signal voltage. The comparison output becomes a Low level when the ramp voltage is equal to or less than the signal voltage.

The first latch unit 116 receives the comparison output of the comparison unit 108 and latches (retains and stores) the digital data in the logic state generated by the clock generation unit 18 (the VCO 101 and the count unit 103) at a timing at which the comparison output is inverted. The digital data latched by the first latch unit 116 is transmitted to the second latch unit 116'.

Here, the digital data of the low-order latch unit 105 and the low-order latch unit 105' is, for example, 9-bit data. Further, the digital data of the high-order latch unit 107 and the high-order latch unit 107' is, for example, 10-bit data. Further, 10 bits are just an example. The number of bits less than 10 bits (for example, 8 bits) or the number of bits greater than 10 bits (for example, 12 bits) may be used. In the ADC unit 16, the latch unit 116 and the latch unit 116' are disposed in the upper and lower sides, but this configuration is just an example. For example, to shorten a transmission time, it is desirable to dispose the corresponding respective bits of the corresponding latch unit so as to be close to one another.

Next, an operation of this example will be described. Here, the specific operation of the unit pixel 3 will not be described. However, as known, the unit pixel 3 outputs a reset level and a signal level.

The A/D conversion is performed as follows. That is, for example, the digital data corresponding to the magnitude of the reset level or the signal level is obtained by comparing the ramp wave falling at a predetermined inclination to the voltage of the reset level or the signal level, which is a pixel signal from the unit pixel 3, counting a period from the generation time of the ramp use used for the comparison process to a time, at which a signal corresponding to the reset level or the signal level matches the ramp wave (ramp voltage) by the clock (for example, CK8) output from the VCO 101, and measuring the logic state of the multi-phase clocks (CK0, CK1, CK2, CK3, CK4, CK5, CK6, CK7, and CK8) having a constant phase difference.

Here, the reset level containing a noise of the pixel signal is read as an analog pixel signal from each unit pixel 3 of a selected row in the imaging unit 2 by a first reading process, and then the signal level is read by a second reading process. Then, the reset level and the signal level are chronologically input to the ADC unit 16 via the vertical signal line 13. Hereinafter, the first and second reading processes and a subsequent calculating process will be described in detail.

<First Reading Process>

After the first reading process from the unit pixel 3 of any pixel row to the vertical signal line 13 is stabilized, the control unit 20 supplies control data for generating the ramp wave to the ramp unit 19. The ramp unit 19 receiving the control data outputs the ramp wave of which a waveform varies temporally in a ramp shape as a whole, as a comparison voltage given to one input terminal of the comparison unit 108. The comparison unit 108 compares the ramp wave to the reset level. The logic states of the VCO 101 and the count unit 103 are output to the low-order latch unit 105 and the high-order latch unit 107 included in the first latch unit 116.

The comparison unit 108 compares the ramp wave supplied from the ramp unit 19 to the reset level. When the voltages of both the ramp wave and the reset level are substantially the same as each other, the comparison unit 108 inverts the comparison output. The low-order latch unit 105 and the high-order latch unit 107 of the first latch unit 116 maintain the logic states of the VCO 101 and the count unit 103, respectively, at the time at which the comparison output is inverted. When a predetermined period expires, the control unit 20 stops supplying the control data to the ramp unit 19 and stops the output from the clock generation unit 18. Thus, the ramp unit 19 stops generating the ramp wave. Thereafter, the data retained in the first latch unit 116 is transmitted to the second latch unit 116'. At this time, the data retained in the low-order latch unit 105 is transmitted to the low-order latch unit 105' and the data retained in the high-order latch unit 107 is transmitted to the high-order latch unit 107'.

<Second Reading Process>

Subsequently, at the second reading time, a signal level corresponding to the amount of light incident on each unit pixel 3 is read and the same process as the first reading process is performed. After the second reading process from the unit pixel 3 of any pixel row to the vertical signal line 13 is stabilized, the control unit 20 supplies the control data for generating the ramp wave to the ramp unit 19. The ramp unit 19 receiving the control data outputs the ramp wave of which a waveform varies temporally in a ramp shape as a whole, as a comparison voltage given to one input terminal of the comparison unit 108. The comparison unit 108 compares the ramp wave to the reset level. The logic states of the VCO 101 and the count unit 103 are output to the low-order latch unit 105 and the high-order latch unit 107 included in the first latch unit 116.

The comparison unit 108 compares the ramp wave supplied from the ramp unit 19 to the signal level. When the voltages of both the ramp wave and the signal level are substantially the same as each other, the comparison unit 108 inverts the comparison output. The low-order latch unit 105 and the high-order latch unit 107 of the first latch unit 116 maintain the logic states of the VCO 101 and the count unit 103, respectively, at the time at which the comparison output is inverted. When a predetermined period expires, the control unit 20 stops supplying the control data to the ramp unit 19 and stops the output from the clock generation unit 18. Thus, the ramp unit 19 stops generating the ramp wave.

<Calculating Process>

The digital data latched by the first latch unit 116 and the second latch unit 116' is output via the horizontal signal line 118 by the horizontal selection unit 14 and is transmitted to the calculation unit included in the output unit 17. Thereafter, the calculation unit performs a binarization process and a subtraction process (a difference process of the data with the reset level and the data with the signal level) to obtain synthesized data of the signal components.

In this embodiment, as described above, the low-order logic state formed from the multi-phase clocks having the constant phase difference is set to low-order bits and the high-order logic state generated by setting one of the multi-phase clocks as a count clock are set to high-order bits. The logic state of the multi-phase clocks is maintained when the comparison output obtained by comparing the analog pixel signal to the ramp wave is inverted. Thus, a bit string having detailed time information can be obtained without constraint on the process speed of a counter. Since the high-order bits are completely dependent on the low-order bits, there is no miscode caused due to the phase deviation which is problematic at a high speed time in principle. Further, since only rise or fall of the multi-phase clocks forming the low-order bits are used, the solid-state imaging apparatus having no binarization error can be provided.

By performing the difference process of the data with the reset level and the data with the signal level, the A/D conversion can be performed on the signal components at high speed and with high accuracy.

Since the data with the reset level latched by the first latch unit 116 is transmitted to the second latch unit 116' and then the data with the signal level is latched by the first latch unit 116, the data with the reset level and the signal level can be latched by the first latch unit 116. Therefore, it is possible to prevent a hold error of the data caused due to an individual difference of the characteristics of the latch units.

Fourth Embodiment

Figure 21:
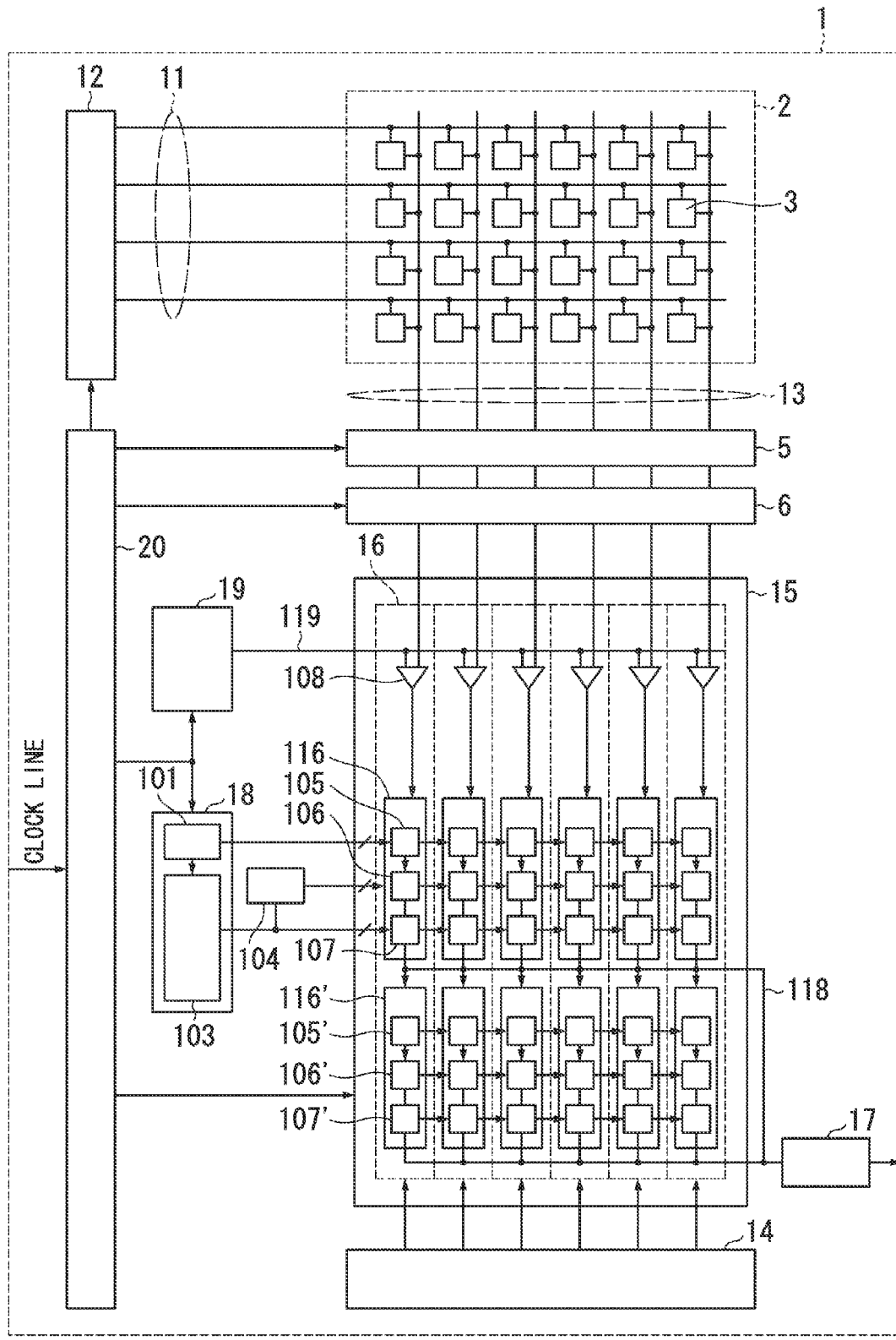
FIG. 21 is a block diagram illustrating the configuration of a solid-state imaging apparatus according to a fourth embodiment of the present invention.

FIG. 21 is a diagram illustrating an example of the overall configuration of a (C)MOS solid-state imaging apparatus according to a fourth embodiment of the present invention. Hereinafter, the configuration shown in FIG. 21 will be described. FIG. 21 is different from FIG. 19 in that a first redundant high-order latch unit 106 and a second redundant high-order latch unit 106' are provided to maintain a redundant high-order logic state delayed from the high-order logic state from the count unit 103 only by a given delay time. Since the remaining configuration is the same as that shown in FIG. 19, the description thereof will not be repeated here.

Next, since a basic process of this example is the same as the processes of the second and third embodiments, the process of this example will not be described here.

In this embodiment, as described above, the high-order logic state and the redundant high-order logic state delayed from the high-order logic state can be output. Therefore, for example, even when a timing at which the data is retained is deviated (mismatched) between the low-order logic state and the high-order logic state, the data can be corrected by using the data maintaining the redundant high-order logic state.

Fifth Embodiment

Figure 22:
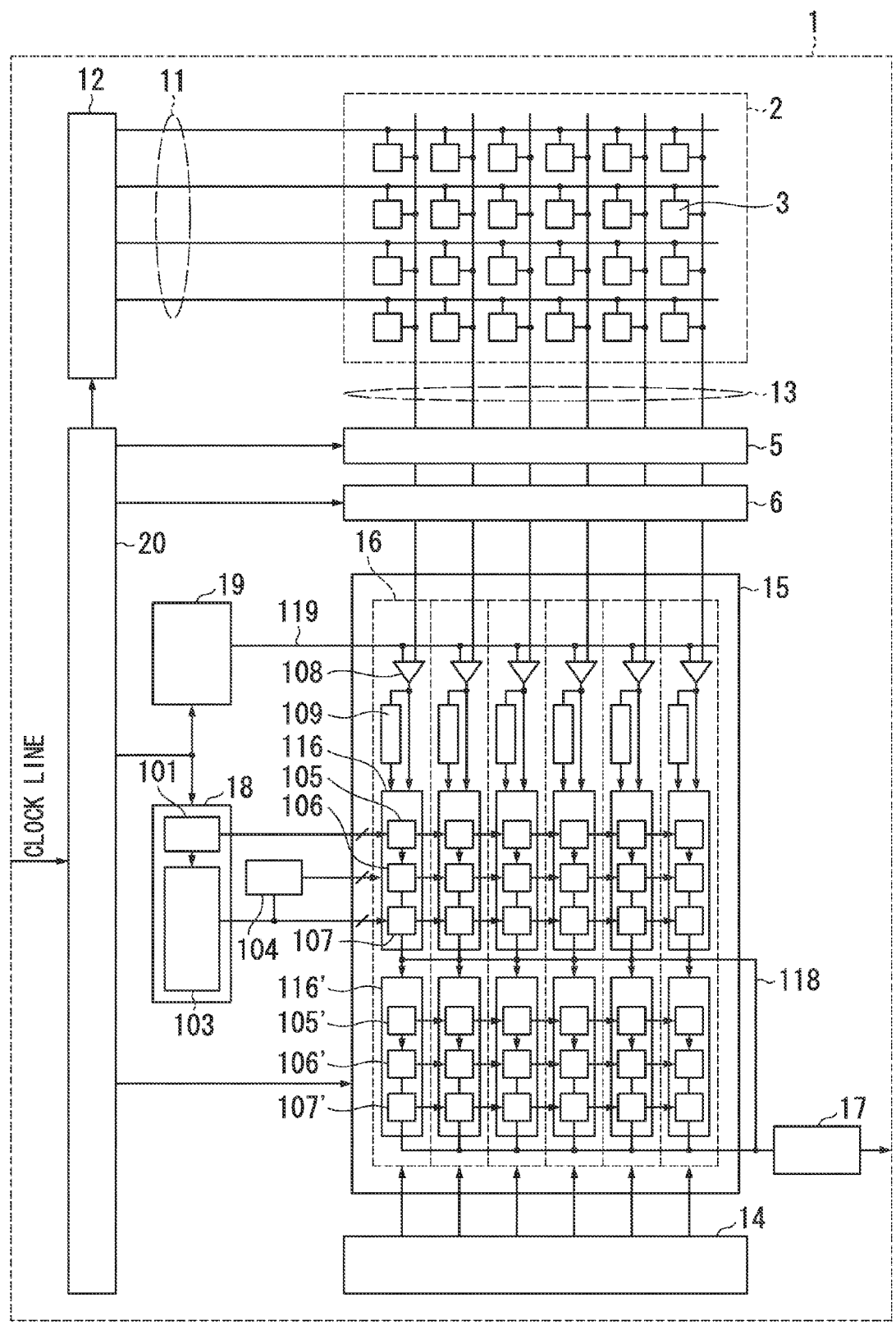
FIG. 22 is a block diagram illustrating the configuration of a solid-state imaging apparatus according to a fifth embodiment of the present invention.

FIG. 22 is a diagram illustrating an example of the overall configuration of a (C)MOS solid-state imaging apparatus according to a fifth embodiment of the present invention. Hereinafter, the configuration shown in FIG. 22 will be described. FIG. 22 is different from FIG. 21 in that a comparison delay unit 109 is provided to delay and output the comparison output delayed from the comparison output of the comparison unit 108 only by a given delay time. Since the remaining configuration is the same as that shown in FIG. 21, the description thereof will not be repeated here.

Next, since a basic process of this example is the same as the processes of the second and third embodiments, the process of this example will not be described here.

In this embodiment, as described above, the high-order logic state and the redundant high-order logic state delayed from the high-order logic state can be output. Therefore, for example, even when a timing at which the data is retained is deviated (mismatched) between the low-order logic state and the high-order logic state, the data can be corrected by using the data maintaining the redundant high-order logic state. Further, since the comparison unit 108 can output the comparison result and can delay and output the comparison result by the given delay time, the input timing of the data is consequently controlled. Therefore, a more suitable input timing can be controlled.

Sixth Embodiment

Figure 23:
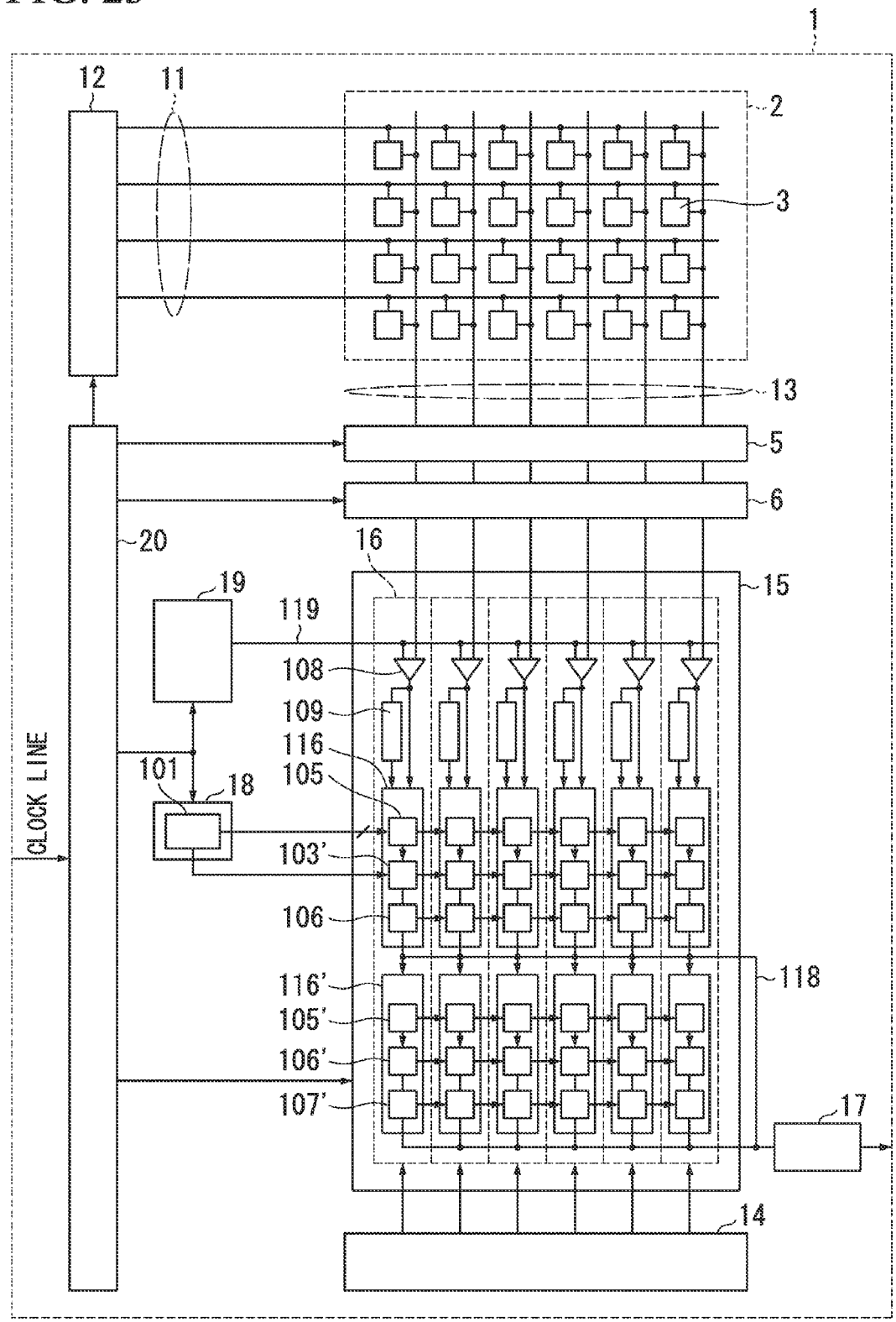
FIG. 23 is a block diagram illustrating the configuration of a solid-state imaging apparatus according to a sixth embodiment of the present invention.
Figure 24:
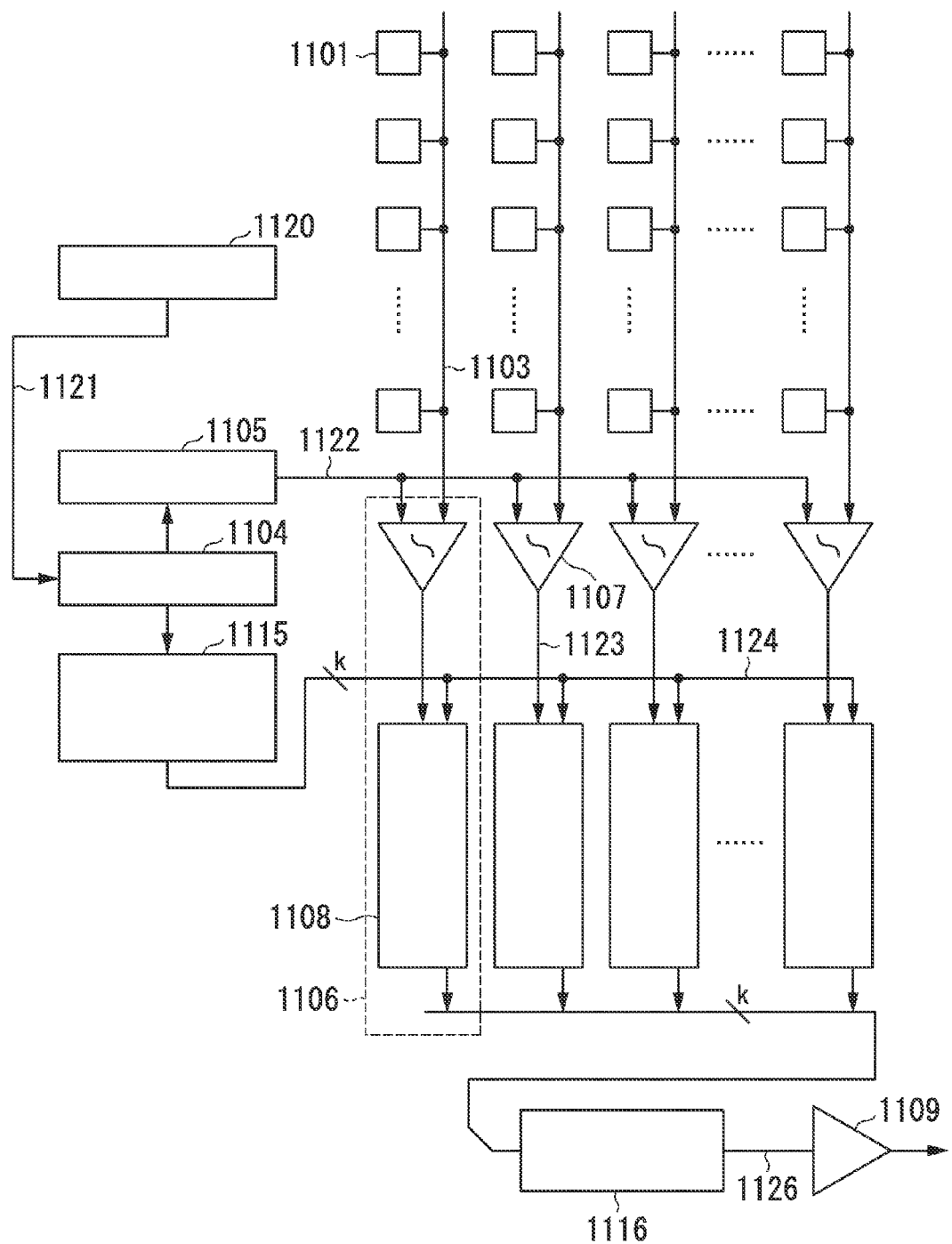
FIG. 24 is a block diagram illustrating the configuration of a MOS sensor using an A/D converter according to a related art.

FIG. 23 is a diagram illustrating an example of the overall configuration of a (C)MOS solid-state imaging apparatus according to a sixth embodiment of the present invention. Hereinafter, the configuration shown in FIG. 23 will be described. FIG. 23 is different from FIG. 19 in that each ADC unit 16 has the count unit 103 as a column counter 103' therein, a comparison delay unit 109 is provided to delay and output the comparison result of the comparison unit 108 only by a given delay time, and a first redundant high-order latch unit 106 and a second redundant high-order latch unit 106' are provided to maintain a redundant high-order logic state delayed from the high-order logic state from the count unit 103 only by a given delay time. Since the remaining configuration is the same as that shown in FIG. 19, the description thereof will not be repeated here. Here, the column counter 103' is assumed as a counter circuit that also has a latch function of maintaining the high-order logic state. With such a configuration, it is not necessary to separately include a first high-order latch unit. Further, an Up/Down counter circuit may be used as the column counter 103'. In this case, since the number of included latch circuits can be reduced, the area can be decreased.

Next, a process of this example will be described. The basic process is the same as that of the third to fifth embodiment, but the main points will be described in detail again. The A/D conversion is performed as follows. That is, for example, the digital data corresponding to the magnitude of the reset level or the signal level is obtained by comparing the ramp wave falling at a predetermined inclination to the voltage of the reset level or the signal level, which is a pixel signal from the unit pixel 3, counting a period from the generation time of the ramp used for the comparison process to a time, at which a signal corresponding to the reset level or the signal level matches the ramp wave (ramp voltage) by the clock (for example, CK8) output from the VCO 101, and measuring the logic state of the multi-phase clocks (CK0, CK1, CK2, CK3, CK4, CK5, CK6, CK7, and CK8) having a constant phase difference.

Here, the reset level containing a noise of the pixel signal is read as an analog pixel signal from each unit pixel 3 of a selected row in the imaging unit 2 by a first reading process, and then the signal level is read by a second reading process. Then, the reset level and the signal level are chronologically input to the ADC unit 16 via the vertical signal line 13. Hereinafter, the first and second reading processes and a subsequent calculating process will be described in detail.

<First Reading Process>

After the first reading process from the unit pixel 3 of any pixel row to the vertical signal line 13 is stabilized, the control unit 20 supplies control data for generating the ramp wave to the ramp unit 19. The ramp unit 19 receiving the control data outputs the ramp wave of which a waveform varies temporally in a ramp shape as a whole, as a comparison voltage given to one input terminal of the comparison unit 108. The comparison unit 108 compares the ramp wave to the reset level. The low-order logic state of the VCO 101 is retained in the low-order latch unit 105 forming the first latch unit 116. Further, one of the clocks in the low-order logic state is used as a count clock of the column counter 103'.

The comparison unit 108 compares the ramp wave supplied from the ramp unit 19 to the reset level. When the voltages of both the ramp wave and the reset level are substantially the same as each other, the comparison unit 108 inverts the comparison output. A timing of the output is set as a first timing. Further, the comparison delay unit 109 delays and outputs the comparison output from the comparison unit 108 only by a given delay time. A timing of the output is set to a second timing.

At the first timing, the redundant high-order logic state of the column counter 103' is maintained in the redundant high-order latch unit 106. Subsequently, at the second timing, the low-order logic state of the VCO 101 is maintained in the low-order latch unit 105, and the column counter 103' maintains the high-order logic state, for example, by stopping the count process of the column counter 103'. When a predetermined period expires, the control unit 20 stops supplying the control data to the ramp unit 19 and stops the output from the clock generation unit 18. Thus, the ramp unit 19 stops generating the ramp wave. Thereafter, the data retained in the first latch unit 116 is transmitted to the second latch unit 116'. At this time, the data retained in the low-order latch unit 105 is transmitted to the low-order latch unit 105', the data retained in the column counter 103' is transmitted to the high-order latch unit 107', and the data retained in the redundant high-order latch unit 106 is transmitted to the redundant high-order latch unit 106'.

<Second Reading Process>

Subsequently, at the second reading time, a signal level corresponding to the amount of light incident on each unit pixel 3 is read and the same process as the first reading process is performed. After the second reading process from the unit pixel 3 of any pixel row to the vertical signal line 13 is stabilized, the control unit 20 supplies the control data for generating the ramp wave to the ramp unit 19. The ramp unit 19 receiving the control data outputs the ramp wave of which a waveform varies temporally in a ramp shape as a whole, as a comparison voltage given to one input terminal of the comparison unit 108. The comparison unit 108 compares the ramp wave to the reset level. The low-order logic state of the VCO 101 is retained in the low-order latch unit 105 forming the first latch unit 116. Further, one of the clocks in the low-order logic state is used as a count clock of the column counter 103'.

The comparison unit 108 compares the ramp wave supplied from the ramp unit 19 to the signal level. When the voltages of both the ramp wave and the signal level are substantially the same as each other, the comparison unit 108 inverts and outputs the comparison output. A timing of the output is set as a first timing. Further, the comparison delay unit 109 delays and outputs the comparison output from the comparison unit 108 only by a given delay time. A timing of the output is set to a second timing.

At the first timing, the redundant high-order logic state of the column counter 103' is maintained in the redundant high-order latch unit 106. Subsequently, at the second timing, the low-order logic state of the VCO 101 is maintained in the low-order latch unit 105, and the column counter 103' maintains the high-order logic state, for example, by stopping the count process of the column counter 103'. When a predetermined period expires, the control unit 20 stops supplying the control data to the ramp unit 19 and stops the output from the clock generation unit 18. Thus, the ramp unit 19 stops generating the ramp wave.

<Calculating Process>

The digital data retained in the first and second latch units is output via the horizontal signal line 118 by the horizontal selection unit 14 and is transmitted to the calculation unit included in the output unit 17. Thereafter, the calculation unit performs a binarization process and a subtraction process to obtain synthesized data of the signal components.

In this embodiment, as described above, the low-order logic state formed from the multi-phase clocks having the constant phase difference is set to low-order bits and the high-order logic state generated by setting one of the multi-phase clocks as a count clock are set to high-order bits. The logic state of the multi-phase clocks is maintained when the comparison output obtained by comparing the analog pixel signal to the ramp wave is inverted. Thus, a bit string having detailed time information can be obtained without constraint on the process speed of a counter. Since the high-order bits are completely dependent on the low-order bits, there is no miscode caused due to the phase deviation which is problematic at a high speed time in principle. Further, since only rise or fall of the multi-phase clocks forming the low-order bits are used, the solid-state imaging apparatus having no binarization error can be provided.

Further, the high-order logic state and the redundant high-order logic state can be output. Therefore, for example, even when the timing at which the data is retained is deviated (mismatched) between the low-order logic state and the high-order logic state, the data can be corrected by using the data maintaining the redundant high-order logic state. Accordingly, it is possible to realize the solid-state imaging apparatus with high accuracy.

In FIG. 19, although not illustrated in the drawing, it is necessary to provide a buffer circuit that transmits the high-order logic state of the count unit 103 to the high-order latch unit 107. However, In FIG. 23, the buffer circuit is not necessary, since the column counter 103' is provided for each column of the imaging unit 2 and the clock from the VCO 101 is used as the count clock of the column counter 103'.

In a case where the column counter 103' is configured by the use of the Up/Down counter circuit, for example, the count is performed as down-count when the column counter 103' performs the first reading process. In addition, the count may be performed as up-count when the column counter 103' performs the second reading process. Thus, a CDS process of the high-order data with the reset level and the high-order data with the signal level can be performed.

As descried above, according to the present invention, in regard to the high-order logic state and the low-order logic state, a phase relation between the high-order logic state and the low-order logic state is maintained based on the output of the same ring delay circuit. Accordingly, the A/D conversion can be performed with higher accuracy.

In addition, according to the present invention, the transition position can be detected with reference to only the rising and falling of a signal by rearranging the data of the low-order latch unit to the signal groups rising in order at the given time interval or falling in order at the a given time interval and detecting the transition position of the state in the signal group at the first timing related to the end of the comparison process. Accordingly, the A/D conversion can be performed with higher accuracy.

The embodiments of the present invention have hitherto been described with reference to the drawings, but the specific configurations are not limited to the above-described embodiments. The present invention is modified within the scope of the present invention without departing from the gist of the present invention.

INDUSTRIAL APPLICABILITY

According to the present invention, as described above, it is possible to provide an A/D converter capable of performing A/D conversion with higher accuracy and a solid-state imaging apparatus using the A/D converter.

REFERENCE SIGNS LIST

1: imaging unit, 5: read current source unit, 6: analog unit, 12: vertical selection unit, 14: horizontal selection unit, 15: column processing unit, 16: ADC unit, 17: output unit, 18: clock generation unit, 19: ramp unit, 20: control unit, 101: VCO, 103: count unit, 103': column counter, 104: count delay unit, 105, 105': low-order latch unit, 106, 106': redundant high-order latch unit, 107, 107': high-order latch unit, 108: comparison unit, 109: comparison delay unit, 116: first latch unit, 116': second latch unit, 117: calculation unit, 121: charge supply circuit, 122: integration circuit, 126: variable current source, 131: DAC circuit, 132: LPF circuit, 133: buffer circuit

The invention claimed is:

1. An analog-to-digital (AD) converter comprising:
a reference signal generation unit that generates a reference signal that increases or decreases over time;
a comparison unit that starts a comparison process of comparing an analog signal to the reference signal at a timing related to input of the analog signal to be subjected to A/D conversion and ends the comparison process at a timing at which the reference signal satisfies a predetermined condition with respect to the analog signal;
a ring delay circuit that includes a plurality of delay units and starts a transition process at a timing related to the start of the comparison process;
a count unit that counts a clock from the ring delay circuit and retains a count value as a high-order logic state at a first timing related to the end of the comparison process;
a low-order latch unit that latches a low-order logic state, which is a logic state of the plurality of delay units, at said first timing related to the end of the comparison process; and
a calculation unit that calculates a digital signal related to the analog signal based on data of the low-order latch unit and the count unit,
wherein the calculation unit rearranges the data of the low-order latch unit, which is output from the plurality of delay units, to signal groups rising in order at a given time interval or falling in order at a given time interval, and
wherein the calculation unit detects a state transition position in the signal group at the first timing related to the end of the comparison process.

2. A solid-state imaging apparatus comprising:
an imaging unit in which a plurality of pixels outputting a pixel signal in accordance with an amount of an electromagnetic wave are arranged in a matrix form;
the A/D converter according to claim 1 that employs an analog signal corresponding to the pixel signal as an analog signal to be subjected to A/D conversion; and
a control unit that controls the imaging unit and the A/D converter.

3. The solid-state imaging apparatus according to claim 2, wherein the count unit is provided in each column of the imaging unit to configure a column count unit, and
wherein the clock from the ring delay circuit is used as a count clock of the column count unit.

4. The A/D converter according to claim 1, wherein the number of delay units is odd.

5. The A/D converter according to claim 1, wherein the number of delay units is odd and each of the plurality of delay units includes an odd number of inversion elements.

6. The A/D converter according to claim 1, wherein the plurality of delay units are configured to control delay amounts of the delay units.

7. The A/D converter according to claim 6, wherein the delay amount of each of the plurality of delay units is controlled by a current flowing in the delay unit.

8. The A/D converter according to claim 1,
wherein the count unit outputs a redundant high-order logic state other than the high-order logic state,
wherein the A/D converter further comprises a redundant high-order latch unit that latches the redundant high-order logic state, as a latch unit, other than the low-order latch unit and the count unit, and
wherein the redundant high-order logic state is a state where at least a part of the high-order logic state is delayed by a given time or the high-order logic state is a state where at least a part of the redundant high-order logic state is delayed by a given time.

9. The A/D converter according to claim 1, wherein the reference signal generation unit is configured by a DAC circuit.

10. The A/D converter according to claim 9, wherein the reference signal generation unit further includes a LPF circuit at a rear stage of the DAC circuit.

11. The A/D converter according to claim 10, wherein a filter constant of the LPF circuit is controlled in accordance with at least a delay amount of the delay unit and a quantization step of the DAC circuit.

\* \* \* \* \*